(12) United States Patent
Fernandez et al.

(10) Patent No.: US 9,621,140 B1
(45) Date of Patent: Apr. 11, 2017

(54) ELECTRONIC CIRCUIT FOR DRIVING AN OUTPUT CURRENT SIGNAL AND METHOD OF DRIVING THE OUTPUT CURRENT SIGNAL FROM THE ELECTRONIC CIRCUIT TO ACHIEVE AN ALTERED TRANSITION OF THE OUTPUT CURRENT SIGNAL

(71) Applicant: Allegro Microsystems, LLC, Worcester, MA (US)

(72) Inventors: Devon Fernandez, Londonderry, NH (US); Eric Burdette, Reddick, FL (US)

(73) Assignee: Allegro MicroSystems, LLC, Worcester, MA (US)

( * ) Notice: Subject to any disclaimer, the term of this patent is extended or adjusted under 35 U.S.C. 154(b) by 0 days.

(21) Appl. No.: 14/996,689

(22) Filed: Jan. 15, 2016

(51) Int. Cl.
| | | |
|---|---|---|
| H03K 3/00 | (2006.01) | |
| H03K 5/04 | (2006.01) | |
| H03K 17/64 | (2006.01) | |
| H03K 17/60 | (2006.01) | |
| G01R 33/06 | (2006.01) | |

(52) U.S. Cl.
CPC .............. *H03K 5/04* (2013.01); *G01R 33/06* (2013.01); *H03K 17/60* (2013.01); *H03K 17/64* (2013.01)

(58) Field of Classification Search
USPC ........................ 327/108–110; 326/82, 86, 90
See application file for complete search history.

(56) References Cited

U.S. PATENT DOCUMENTS

| | | |
|---|---|---|
| 5,859,552 A | 1/1999 | Do et al. |
| 5,949,254 A | 9/1999 | Keeth |
| 6,118,310 A | 9/2000 | Esch, Jr. |
| 6,300,806 B1 | 10/2001 | Theus et al. |
| 6,380,728 B1 | 4/2002 | Tareilus et al. |
| 6,509,757 B1 | 1/2003 | Humphrey |
| 6,815,944 B2 | 11/2004 | Vig et al. |
| 7,026,808 B2 | 4/2006 | Vig et al. |
| 7,148,725 B1 | 12/2006 | Chan et al. |
| 8,035,418 B2 | 10/2011 | Oh et al. |
| 8,674,747 B2 * | 3/2014 | Iwasaki .......... H03K 19/018571 327/108 |
| 8,957,715 B2 | 2/2015 | Eagen |
| 9,473,142 B2 * | 10/2016 | Chen .................... G11C 7/1057 |
| 2002/0093366 A1 | 7/2002 | Fotouhi |
| 2008/0272813 A1 | 11/2008 | Bouillet |
| 2011/0291707 A1 | 12/2011 | Illegems |
| 2013/0002301 A1 * | 1/2013 | Gondi ............ H03K 19/018557 326/83 |

FOREIGN PATENT DOCUMENTS

| | | |
|---|---|---|
| DE | 692 31 612 | 5/2001 |
| DE | 10 2014 010 202 | 5/2015 |
| EP | 2 816 487 | 12/2014 |

OTHER PUBLICATIONS

Restriction Requirement dated Dec. 11, 2013; for U.S. Appl. No. 13/653,824; 6 pages.

(Continued)

*Primary Examiner* — An Luu
(74) *Attorney, Agent, or Firm* — Daly, Crowley, Mofford & Durkee, LLP

(57) ABSTRACT

An electronic circuit has a current generator circuit that generates a two-state output current signal for which a transition between states is altered.

27 Claims, 9 Drawing Sheets

(56) References Cited

OTHER PUBLICATIONS

Response dated Dec. 31, 2013 to Restriction Requirement dated Dec. 11, 2013; for U.S. Appl. No. 13/653,824; 12 pages.
Office Action dated Mar. 7, 2014; for U.S. Appl. No. 13/653,824; 22 pages.
U.S. Appl. No. 14/954,133, filed Nov. 30, 2015, Ross, et al.
Response dated May 30, 2014 to Office Action dated Mar. 7, 2014; For U.S. Appl. No. 13/653,824; 19 pages.
Final Office Action dated Jun. 16, 2014; For U.S. Appl. No. 13/653,824; 27 pages.
Applicant Initiated Interview dated Sep. 10, 2014; For U.S. Appl. No. 13/653,824; 3 pages.
Request for Continued Examination dated Oct. 10, 2014; For U.S. Appl. No. 13/653,824; 3 pages.
Response dated Oct. 10, 2014 to Final Office Action dated Jun. 16, 2014; For U.S. Appl. No. 13/653,824; 18 pages.
Notice of Allowance dated Oct. 29, 2014; For U.S. Appl. No. 13/653,824; 10 pages.
German Office Action with English translation dated Sep. 1, 2015; For German Pat. App. No. 102013111113.0; 12 pages.
Reporting Letter and Response to German Office Action dated Sep. 1, 2015 corresponding to German Patent Application No. 102013111113.0; Response filed on Mar. 4, 2016; 34 Pages.
"LIN Specification Package" by LIN Consortium, Revision 2.2A dated Dec. 31, 2010; 194 pages.
Search Report and Written Opinion dated Jan. 19, 2017 for PCT Application No. PCT/US2016/061261; 14 pages.

* cited by examiner

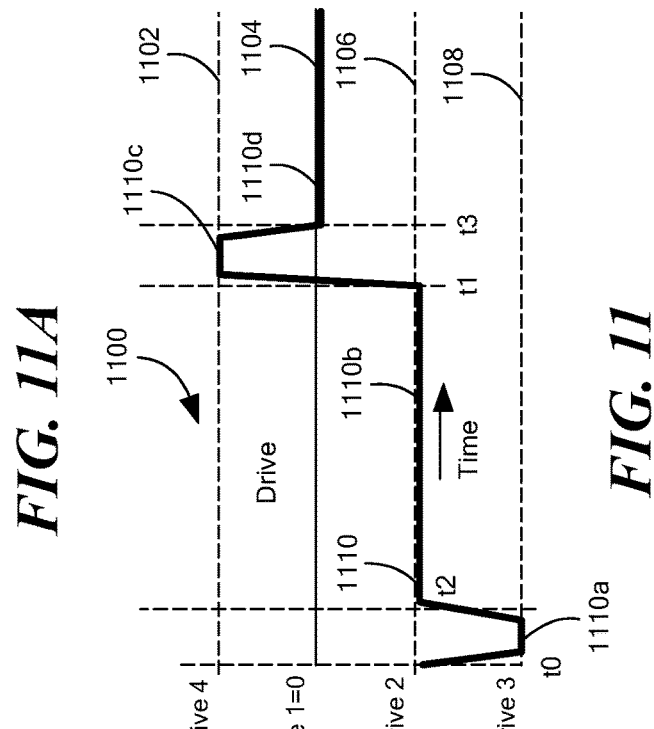
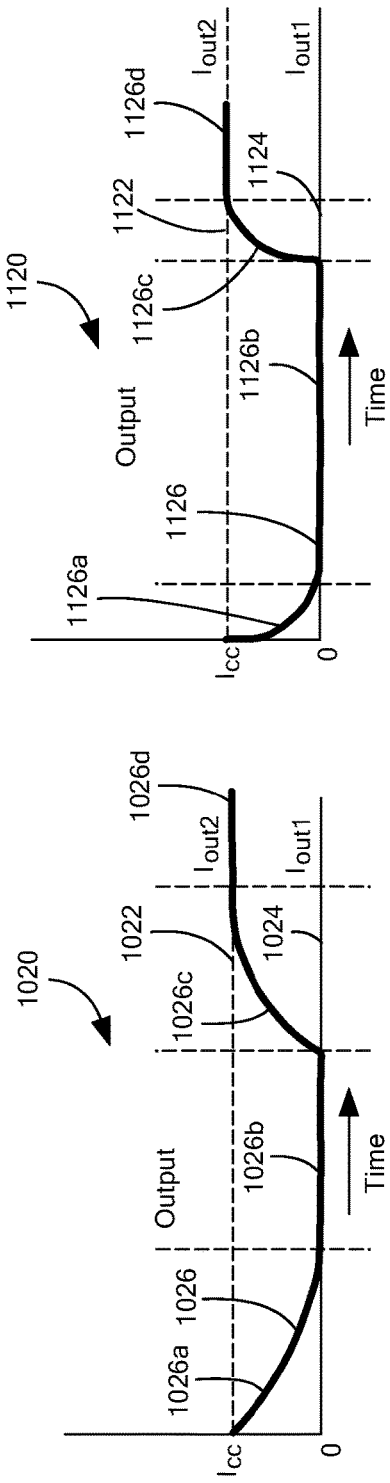
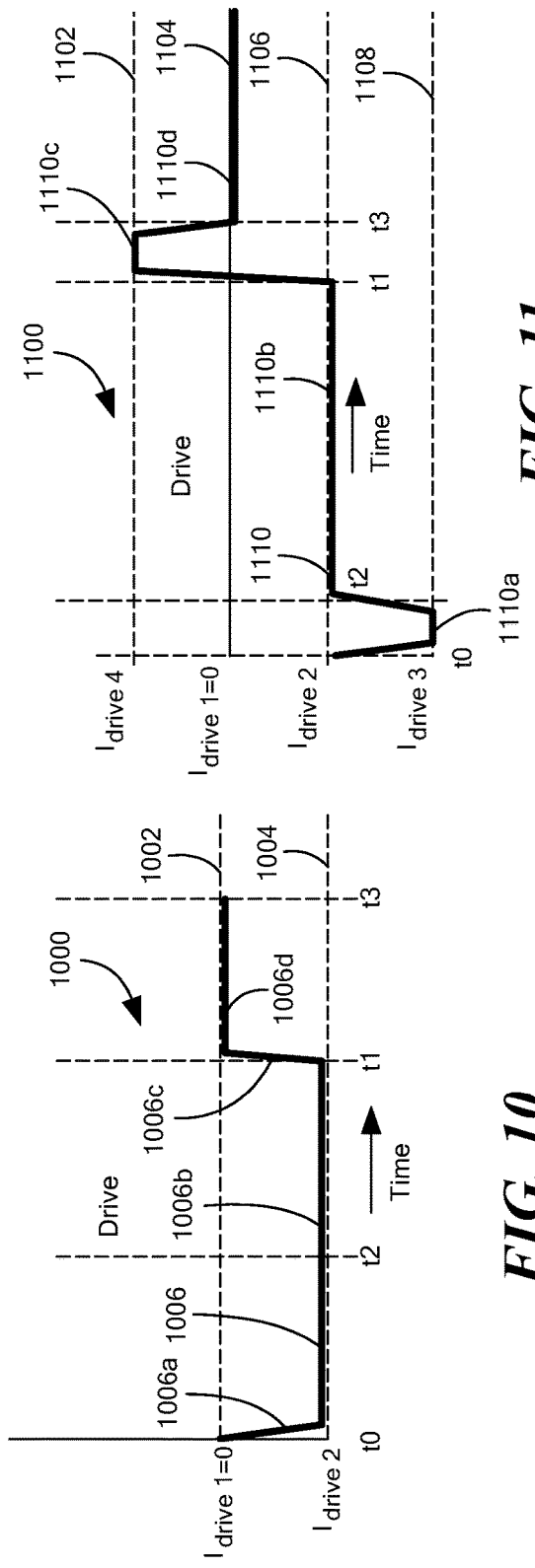

ELECTRONIC CIRCUIT FOR DRIVING AN OUTPUT CURRENT SIGNAL AND METHOD OF DRIVING THE OUTPUT CURRENT SIGNAL FROM THE ELECTRONIC CIRCUIT TO ACHIEVE AN ALTERED TRANSITION OF THE OUTPUT CURRENT SIGNAL

CROSS REFERENCE TO RELATED APPLICATIONS

Not Applicable.

STATEMENT REGARDING FEDERALLY SPONSORED RESEARCH

Not Applicable.

FIELD OF THE INVENTION

This invention relates generally to electronic circuits and, more particularly, to an electronic circuit for driving an output current signal.

BACKGROUND

Current signal generation is a known technique in which a signal is communicated upon a wire from a source electronic circuit to a destination electronic circuit as an output current signal rather than as an output voltage signal.

In a so-called three-wire arrangement, the current signal is carried from the source electronic circuit to the destination electronic circuit on a first wire, a power supply voltage is carried from the destination electronic circuit to the source electronic circuit on a second wire to power the source electronic circuit, and a reference potential, for example, ground, is provided on a third wire between the source electronic circuit and the destination electronic circuit.

In a so-called two-wire arrangement, the current signal is carried from the source electronic circuit to the destination electronic circuit on a first wire, a power supply voltage is carried from the destination electronic circuit to the source electronic circuit on the same first wire to power the source electronic circuit, and a reference potential, for example, ground, is provided on a second wire between the source electronic circuit and the destination electronic circuit.

The two-wire arrangement may have particular problems due to a desire to filter noise that may occur on the one wire that carries both the current signal and the power supply voltage. The filtering can be performed by a discrete capacitor coupled between the one wire and the ground wire of the two-wire arrangement. The capacitor may result in a low slew rate, i.e., slow transitions, of values of the output current signal carried by the one wire. In addition to the discrete capacitor, there may be a capacitance between the two wires of the two wire arrangement, and/or an inductance in series with one of or both of the two wires, which results in a similar low slew rate.

The three-wire arrangement may also have similar problems. While the power supply voltage can be filtered with a discrete capacitor that is not directly coupled to the wire that carries the current signal, nevertheless, the above-described capacitance between wires of the three wire arrangement, and/or the inductance in series with the wires of the three wire arrangement can result in a low slew rate of the current signal.

It would be desirable to provide a source electronic circuit operable to generate an output current signal carried from the source electronic circuit to a destination electronic circuit in a two wire or in a three wire arrangement for which a slew rate of output current signal transitions is improved.

SUMMARY

The present invention provides a source electronic circuit operable to generate a current signal carried from the source electronic circuit to a destination electronic circuit in a two wire or in a three wire arrangement for which a slew rate of output current signal transitions is improved.

In accordance with an example useful for understanding an aspect of the present invention, an electronic circuit can include a semiconductor substrate, a current node disposed upon the semiconductor substrate and operable to communicate an output current signal from the electronic circuit, a reactance coupled to the current node, and a current driver circuit disposed upon the semiconductor substrate. The current driver circuit can be coupled to the current node. The current driver circuit can be operable to provide a drive current signal with a plurality of drive current values into or out of the current node. The plurality of drive current values can result in the output current signal with a first output current value and a second different output current value. The plurality of drive current values can include a first drive current value indicative of the first output current value, and a second different drive current value indicative of the second different output current value. The plurality of drive current values can also include at least one of: a third different drive current value different than the second drive current value and operable to result in a first altered transition from the first output current value to the second output current value, the third different drive current value having a first time period that begins proximate in time to a beginning of the first altered transition from the first output current value to the second output current value and ends prior to a beginning of the second different output current value; or a fourth different drive current value different than the first drive current value and operable to result in a second altered transition from the second output current value to the first output current value, the fourth different drive current value having a second time period that begins proximate in time to a beginning of the second altered transition from the second output current value to the first output current value and ends prior to a beginning of the first output current value.

In accordance with an example useful for understanding another aspect of the present invention, a method of driving an output current signal from a current output node of an electronic circuit disposed on a semiconductor substrate can include providing a current generator circuit to generate a drive current signal with a plurality of drive current values into or out of a current node coupled to the output current signal. The plurality of drive current values results in the output current signal with a first output current value and a second different output current value. The plurality of drive current values can include a first drive current value indicative of the first output current value, and a second different drive current value indicative of the second different output current value. The plurality of drive current values can also include at least one of: a third different drive current value different than the second drive current value and operable to result in a first altered transition from the first output current value to the second output current value, the third different drive current value having a first time period that begins proximate in time to a beginning of the first altered transition from the first output current value to the second output current value and ends prior to a beginning of the second different output current value; or a fourth different drive current value different than the first drive current values and operable to result in a second altered transition from the second output current value to the first output current value, the fourth different drive current value having a second time period that begins proximate in time to a beginning of the second altered transition from the second output current value to the first output current value and ends prior to a beginning of the first output current value.

BRIEF DESCRIPTION OF THE DRAWINGS

The foregoing features of the invention, as well as the invention itself may be more fully understood from the following detailed description of the drawings, in which:

FIG. 10 is a graph showing a different illustrative drive current signal pulse having first and second different drive current values that may be generated within the current driver circuit of FIG. 2;

FIG. 10A is a graph showing a different illustrative output current signal related to the drive current signal pulse of FIG. 10, but as may be carried on a wire between the source electronic circuit of FIG. 2 and a destination electronic circuit, resulting in transitions with a lower slew rate;

FIG. 11 is a graph showing a different illustrative drive current signal pulse having first, second, third, and fourth different drive current values that may be generated within the current driver circuit of FIG. 2;

FIG. 11A is a graph showing a different illustrative output current signal pulse related to the drive current signal pulse of FIG. 11, but as may be carried on a wire between the source electronic circuit of FIG. 2 and a destination electronic circuit, resulting in transitions with a faster slew rate.

DETAILED DESCRIPTION

Figure 1:
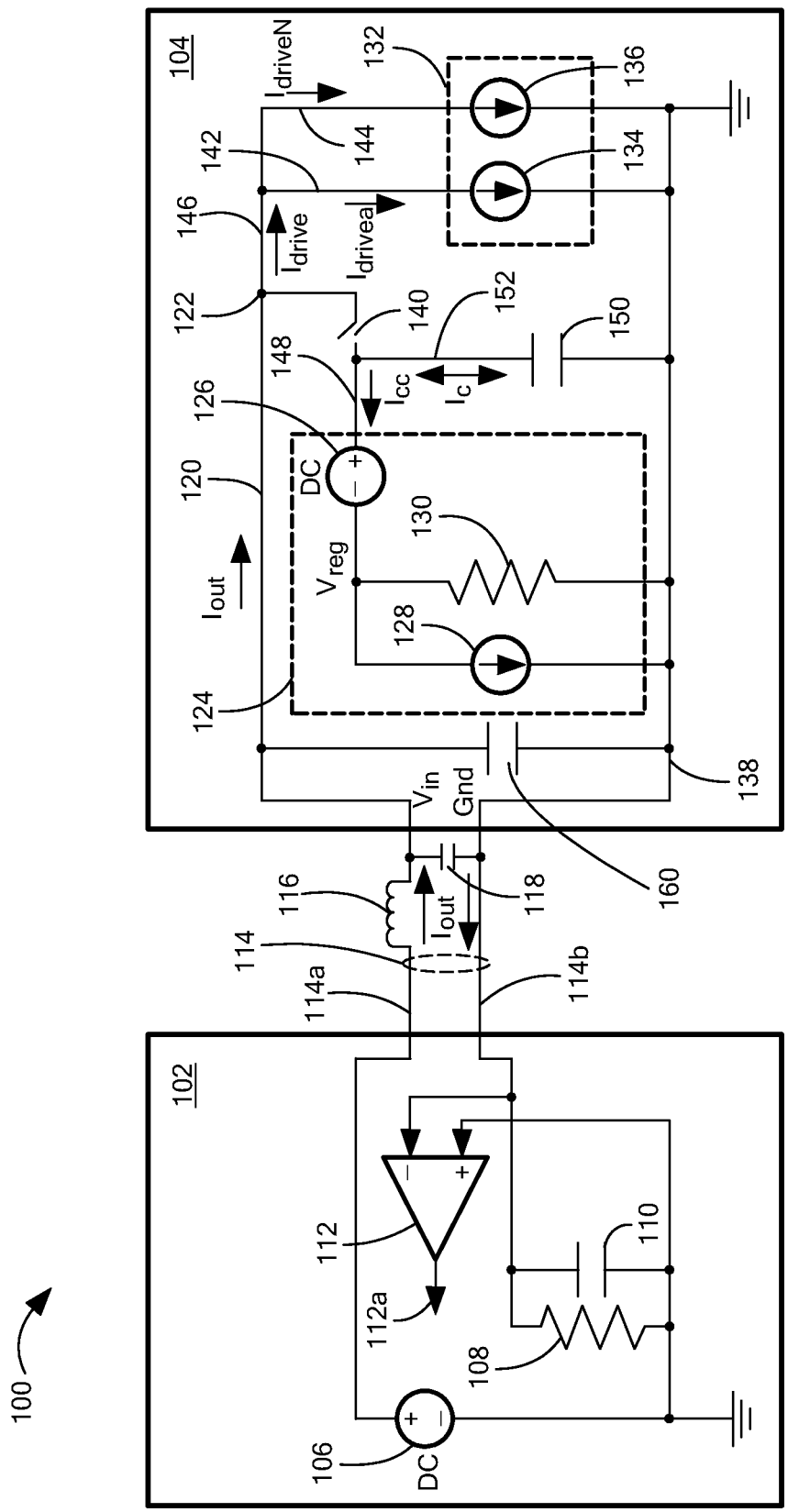
FIG. 1 is a schematic diagram showing an illustrative electronic circuit topology that can be used to simulate a two-wire arrangement for communicating an output current signal from a source electronic circuit to a destination electronic circuit and for providing a voltage from the destination electronic circuit to the source electronic circuit.

Before describing the present invention, some introductory concepts and terminology are explained.

As used herein, the term "magnetic field sensing element" is used to describe a variety of electronic elements that can sense a magnetic field. The magnetic field sensing element can be, but is not limited to, a Hall effect element, a magnetoresistance element, or a magnetotransistor. As is known, there are different types of Hall effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, for example, a spin valve, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

As is known, some of the above-described magnetic field sensing elements tend to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. In particular, planar Hall elements tend to have axes of sensitivity perpendicular to a substrate, while metal based or metallic magnetoresistance elements (e.g., GMR, TMR, AMR) and vertical Hall elements tend to have axes of sensitivity parallel to a substrate.

As used herein, the term "magnetic field sensor" is used to describe a circuit that uses a magnetic field sensing element, generally in combination with other circuits. Magnetic field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet or a ferromagnetic target (e.g., gear teeth) where the magnetic field sensor is used in combination with a back-biased or other magnet, and a magnetic field sensor that senses a magnetic field density of a magnetic field.

As used herein, the term "processor" is used to describe an electronic circuit that performs a function, an operation, or a sequence of operations. The function, operation, or sequence of operations can be hard coded into the electronic circuit or soft coded by way of instructions held in a memory device. A "processor" can perform the function, operation, or sequence of operations using digital values or using analog signals.

In some embodiments, the "processor" can be embodied in an application specific integrated circuit (ASIC), which can be an analog ASIC or a digital ASIC. In some embodiments, the "processor" can be embodied in a microprocessor with associated program memory. In some embodiments, the "processor" can be embodied in a discrete electronic circuit, which can be an analog or digital.

As used herein, the term "module" is used to describe a "processor."

A processor can contain internal processors or internal modules that perform portions of the function, operation, or sequence of operations of the processor. Similarly, a module can contain internal processors or internal modules that perform portions of the function, operation, or sequence of operations of the module.

While electronic circuit shown in figures herein may be shown in the form of analog blocks or digital blocks, it will be understood that the analog blocks can be replaced by digital blocks that perform the same or similar functions and the digital blocks can be replaced by analog blocks that perform the same or similar functions. Analog-to-digital or digital-to-analog conversions may not be explicitly shown in the figures, but should be understood.

In particular, it should be understood that a so-called comparator can be comprised of an analog comparator having a two state output signal indicative of an input signal being above or below a threshold level. However the comparator can also be comprised of a digital circuit having an output signal with at least two states indicative of an input signal being above or below a threshold level.

As used herein, the term "predetermined," when referring to a value or signal, is used to refer to a value or signal that is set, or fixed, in the factory at the time of manufacture, or by external means, e.g., programming, thereafter. As used herein, the term "determined," when referring to a value or signal, is used to refer to a value or signal that is identified by a circuit during operation, after manufacture.

As used herein, the term "active electronic component" is used to describe an electronic component that has at least one p-n junction. A transistor, a diode, and a logic gate are examples of active electronic components. In contrast, as used herein, the term "passive electronic component" as used to describe an electronic component that does not have at least one p-n junction. A capacitor, a resistor, and an inductor are examples of passive electronic components.

As used herein, the terms "line" or "linear" can refer to either a straight or a curved line, monotonic or not monotonic.

As used herein, the term "current generator" is used to describe a current sink or a current source.

As used herein, the term "pulse" is used to describe a signal that changes from a first state (high or low) to a second different state (high or low) and then back to the first state. Pulses can be repetitive and can be periodic. A duty cycle of periodic pulses can be any duty cycle greater than zero percent and less than one hundred percent.

Some electronic circuits used in examples below are magnetic field sensors. However, the same circuit techniques can be used with a different type of electronic circuit.

Referring now to FIG. 1, an illustrative electronic circuit 100 can include a source electronic circuit 104 and a destination electronic circuit 102 coupled together in a two-wire arrangement with two wires 114. A first wire 114a can carry both a current signal from the source electronic circuit 104 to the destination electronic circuit 102 and also a power supply voltage from the destination electronic circuit 102 to the source electronic circuit 104. A second wire 114b can be a return wire.

A capacitor 118 can be indicative of a distributed parallel capacitance between the two wires 114. An inductor 116 can be indicative of a distributed series inductance of one of or both of the two wires 114.

It should be understood that any current carried on the first wire 114a is also carried a second wire 114b but in an opposite direction. Thus, it is appropriate to consider both wires 114a, 114b as carrying both a voltage and a current.

The source electronic circuit 104 can include a functional circuit 124 and a current driver circuit 132 coupled together at a current node 122 at which a power supply voltage is received and a current signal is received and generated.

A capacitor 150 can be coupled at a power supply input to the functional circuit 124, e.g., at the current node 122, in order to filter noise that may occur on the first wire 114a and/or on the second wire 114b. In some embodiments, a switch 140 can be coupled between the capacitor 150 and the current node 122. In some embodiments, a capacitor 160 can be coupled across the two wires 114a, 114b to also filter the noise. The capacitor 160 is coupled in parallel with the capacitance 118.

The current driver circuit 132 can be operable to drive a drive current signal 146 with a plurality of drive current values into or out of the current node 122. In some embodiments, the plurality of drive current values is facilitated by a plurality of drive current generators, here shown as first and second drive current generators 134, 136 coupled to the current node 122.

The functional circuit 124 can include any type of functional circuit but here shown to include a voltage source 126, for example, a voltage regulator, coupled to a drive current generator 128 and a resistor 130 that are coupled in parallel.

The destination circuit 102 can include a voltage source 106 coupled to the first wire 114a and operable to provide the power supply voltage to the source circuit 104 at the current node 122, which can be provided through an inductor 116.

The destination circuit 102 can also include a resistor 108 and a capacitor 110 coupled in parallel, the parallel combination coupled at one end to a reference node, e.g. a ground node, and coupled at the other end to an input node of an amplifier 112. The other input node of the amplifier 112 can be coupled to a reference voltage, for example, a ground voltage. The amplifier 112 is operable to generate an amplified voltage signal 112a that is responsive to a current, for example, an AC current, flowing through the first and second wires 114a, 114b generated by the source circuit 104, and which passes through the resistor 108.

With the above arrangement, using only the first and second wires 114a, 114b, the destination circuit 102 can power the source circuit 104 and the source circuit can send an output current signal 120 to the destination circuit 102.

It should be understood that transient signal behavior (e.g., slew rates) of the drive current signal 146 and the output current signal 120 can be different due to operation of the capacitor 150, the capacitor 118, and the inductor 116.

While a two-wire arrangement 114 is shown and described above, techniques described herein can also be used with a three-wire arrangement, in which an output current signal, which can be like the drive current signal 146, is provided on the first and second wires 114a, 114b, and a power supply voltage is provided to the source circuit 104 on a third wire (not shown).

Figure 2:
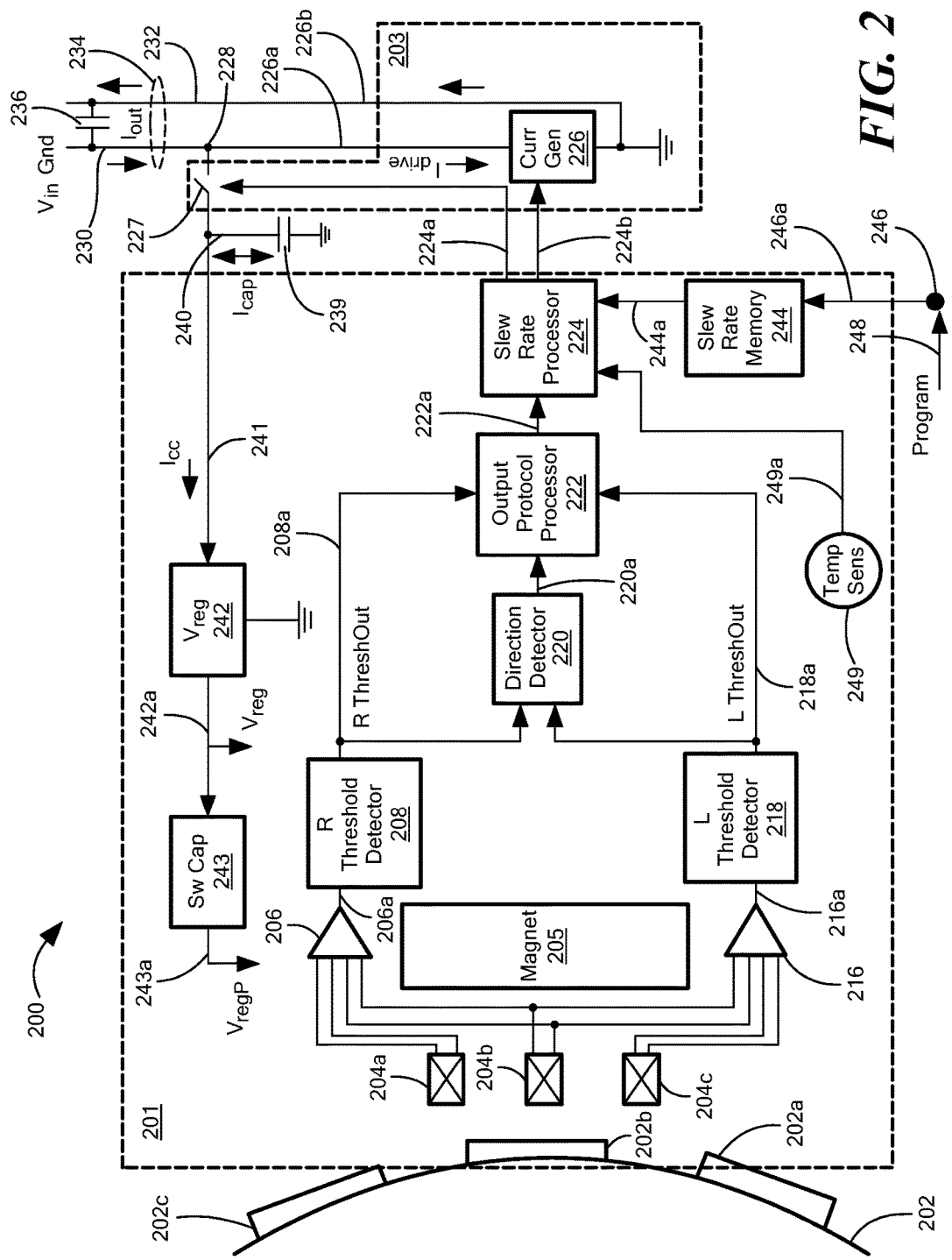
FIG. 2 is a block diagram showing an illustrative source electronic circuit in the form of a magnetic field sensor, which includes a functional circuit and a current driver circuit for generating a drive current signal in a two wire arrangement.

Referring now to FIG. 2, an illustrative source circuit 200 can be in the form of a magnetic field sensor 200. However, it should be understood that other source circuits can be used that are not magnetic field sensors. The source circuit 200 can be representative of the source circuit 104 of FIG. 1.

The magnetic field sensor 100 can include a functional circuit 201 that can be the same as or similar to the functional circuit 124 of FIG. 1. The magnetic field sensor 100 can also include a current driver circuit 203 that can be the same as or similar to the current driver circuit 132 of FIG. 1. The magnetic field sensor 200 can also include a current node 228 that can be the same as or similar to the current node 122 of FIG. 1. The magnetic field 200 sensor can also include a capacitor 239 that can be the same as or similar to the capacitor 150 of FIG. 1. As described above, the capacitor 239 can be operable to reduce noise in a power supply voltage that can be received by a voltage regulator 242 to power the functional circuit 201.

The magnetic field 200 sensor can also include a capacitor 236 that can be the same as or similar to the capacitor 160 and/or 118 of FIG. 1.

For convenience, the capacitance 236 is referred to as a capacitor 236 herein, but the capacitor 236 can be either a discrete capacitor like the capacitor 160 of FIG. 1 or can be representative of the distributed capacitance 118 of FIG. 1. The inductance 116 of FIG. 1 is not shown in FIG. 2, but the two-wire coupling 234 can also include a series inductor.

In some embodiments, the functional circuit 201 and the current driver circuit 203 are disposed on a common semiconductor substrate. In some embodiments, the capacitor 239 and/or 236 are also disposed upon the common semiconductor substrate. In other embodiments, the capacitor 239 and/or 236 are not disposed upon the common semiconductor substrate, but are coupled as shown to the functional circuit 201 and to the current driver circuit 203. In some embodiments, the capacitor 239 and/or 236 are coupled across leads of a lead frame. In these embodiments, the capacitor 239 and/or 236 and a portion of the leads can be surrounded by a package, for example, a plastic package, that also surrounds the above-described common semiconductor substrate.

The functional circuit 201 can include first, second, and third magnetic field sensing elements 204a, 204b, 204c, here having symbols indicative of planar or horizontal Hall effect elements. However, other types of magnetic field sensing elements can be used.

The functional circuit 201 can include a magnet 205 operable to generate a magnetic field proximate to the first, second, and third magnetic field sensing elements 204a, 204b, 204c.

The first, second, and third magnetic field sensing elements 204a, 204b, 204c can be operable to generate respective differential signals.

The differential signals generated by the first, second, and third magnetic field sensing elements 204a, 204b, 204c can be responsive to changes in amplitude and/or direction of the magnetic field generated by the magnet 205 in response to passing ferromagnetic gear teeth 202a, 202b, 202c disposed upon a rotating gear 202.

An amplifier 206 can be coupled to receive respective differential signals from the first and second magnetic field sensing elements 204a, 204b and operable to generate an amplified signal 206a. Similarly, an amplifier 216 can be coupled to receive respective differential signals from the second and third magnetic field sensing elements 204b, 204c and operable to generate an amplified signal 216a.

It should be understood that the amplified signal 206a and the amplified signal 216a can have similar signal characteristics as the gear 202 rotates, but the amplified signal 206a and the amplified signal 216a can be at different phases due to the different physical placements of the associated magnetic field sensing elements relative to the gear 202.

A threshold detector 208 can be coupled to receive the amplified signal 206a and can generate a first threshold signal 208a that can be, for example, a first two-state square wave signal having a frequency related to a rotational speed of the gear 202.

A threshold detector 218 can be coupled to receive the amplified signal 216a and can generate a second threshold signal 218a that can be, for example, a second two-state square wave signal having a frequency related to a rotational speed of the gear 202 but with a phase different than the first threshold signal 208a.

Threshold detectors are known. Let it suffice here to say that the threshold detectors are operable to identify one or more thresholds between positive and negative peaks of the input signals thereto. Threshold detectors compare (e.g., with a comparator) the input signals with the identified thresholds to generate the above-described two-state square wave signals. There can be many different ways that a threshold detector can identify the one or more thresholds.

While threshold detectors 208, 218 are shown and described, in other embodiments, another type of detector can be used, including, but not limited to, a simple comparator with a fixed threshold.

The functional circuit 201 can also include a direction detector module 220 coupled to receive the first and second threshold signals 208a, 218a. As described above, the first and second threshold signals 208a, 218a can have a phase difference with a sign related to a direction of rotation of the gear 202. Thus, the direction detector module 220 can identify a direction of rotation of the gear 202 by detecting a sign of the phase difference of the first and second threshold signals 208a, 218a.

The functional circuit 201 can also include an output protocol processor 222 coupled to receive at least one of the first and second threshold signals 208a, 218a and also a direction signal 220a generated by the direction detector module 220.

The output protocol processor 222 can be operable to generate a formatted signal 222a having information that can convey both a speed of rotation of the gear 202 and also a direction of the rotation of the gear 202. In one particular embodiment, the formatted signal 222a can be a two-state signal having a frequency indicative of the speed of rotation of the gear 202 and having pulses within the two-state signal with pulse widths indicative of the direction of rotation of the gear 202. For example, in some embodiments, the positive going pulses or the negative going pulses of the formatted signal 222a can have pulse widths of about forty-five microseconds when the gear 202 is rotating in a first direction and pulse widths of about ninety (or one hundred eighty) microseconds when the gear 202 is rotating and a second different direction. This type of formatted signal is described, for example, in U.S. Pat. No. 6,815,944 issued Nov. 9, 2004, and in U.S. Pat. No. 7,026,808 issued Apr. 11, 2006, both of which are assigned to the assignee of the present invention, and both of which are incorporated by reference herein in their entirety.

A slew rate processor 224 can be coupled to receive the formatted signal 222a and can be operable to generate at least one of a first control signal 224a or a second control signal 224b. Wave shapes of the drive current signal 226a resulting from the first control signal 224a will be apparent from discussion below in conjunction with FIGS. 3 and 4. Other drive current signals associated with the control signal 224b are described below in conjunction with FIGS. 10 and 11. Let it suffice here to say that, in some embodiments, the first control signal 224a and/or the second control signal 224b result in particular wave shapes that include first and second different currents indicative of first and second different signal states, but also with brief higher current values and/or brief lower current values generated by the current driver circuit 203. To this end, the current driver circuit 203 can include a drive current generator 226 operable to sink the drive current 226a into the current node 228 that can change with time.

The drive current signal 226a is discussed below. However, it will be appreciated that a drive current signal 226b can flow in the opposite direction, which, in some embodiments, can be similar to the drive current signal 226a. Similarly, an output current signal 230 is discussed below. However, it will be appreciated that an output current signal 232 can flow in the opposite direction, which, in some embodiments, can be similar to the output current signal 230.

It will become apparent from discussion below that the drive current signal 226a and the output current signal 230 can have different shapes.

Further to this end, in some embodiments, the current driver circuit 203 can include a switch 227, which, when opened, can reduce a current drawn from the current node 228 as would otherwise power the voltage regulator 242 and therefore, power the functional circuit 201. It should be understood that, while the switch 227 is open, the functional circuit 201 can continue to operate for some period of time, drawing a power supply voltage and current from the capacitor 239.

While the term "drive current signal" is used to describe the drive current signal 226a of FIG. 2 generated by the drive current generator 226, it should be apparent that, for drive currents generated by the drive current generator 226 in an opposite direction (i.e., into the current node 228), the same effect as the opposite direction drive currents can be achieved by operation of the switch 227. In essence, an opposite direction drive current 226a that feeds current into the current node 228 can have the same effect as stopping or reducing a current that is drawn from the current node by operation of the switch 227.

In some embodiments, the functional circuit 201 can also include a voltage boost circuit 243, for example, a switched capacitor voltage doubler 243, coupled to receive a regulated voltage 242a from the voltage regulator 242 and operable to generate a boosted voltage 243a higher than the regulated voltage 242a. Utility of the boosted voltage 243a will become apparent in conjunction with FIG. 12 below.

With the above arrangement, the current driver circuit 203 can draw current pulses from the current node 228 with current values that that are higher at some times and lower at other times, with transitions between the higher and lower current values. While the current driver circuit 203 may generate faster transitions of the drive current signal 226a, it should be appreciated that the capacitor 239 and/or 236 can result in a slower transition (i.e., a slower slew rate) of output current signals 230 (and 232) at a two-wire coupling 234 to a destination circuit (not shown).

The capacitor 239, the capacitor 236, and an inductor (see 116 of FIG. 1) are each types of reactance that can be coupled to the current node 228.

In some embodiments, the functional circuit 201 can include a slew rate memory 244 coupled to receive signal control values 246a from a node 246. In some embodiments, the node 246 can be a so-called probe node to which external test equipment can be coupled during manufacture of a semiconductor substrate on which the magnetic field sensor 200 is fabricated. In other embodiments, the node 246 is accessible from outside of the magnetic field sensor 200, for example, at a pin of a lead frame of the magnetic field sensor 200.

A programming signal 248 can be coupled to the node 246 to provide the signal control values 246a, which can be stored in the slew rate memory 244.

It will become apparent from discussion below in conjunction with FIG. 4 that values stored in the slew rate memory 244 and corresponding stored values 244a provided to the slew rate processor 224 can include, but are not limited to, values indicative of amplitudes of currents into or out of the current node 228 and time periods or durations indicative of the time periods of the amplitudes.

In some embodiments, the functional circuit can include a temperature sensor 249 operable to generate a temperature signal 249a indicative of a temperature of a semiconductor substrate upon which the magnetic field sensor 200 is disposed.

As described above, the capacitor 239 and/or 236 can affect a slew rate of output current signal 230 (and 232) in the two-wire coupling 234. If a capacitance of the capacitor 239 and/or 236 changes with temperature, so also can the above-described slew rate.

In some embodiments, the temperature signal 249a can be used by the slew rate processor 224 to adjust the first and/or second control signals 224a, 224b to control amplitudes and/or time durations of particular current characteristics of the drive current 226a flowing into or out of the current node 228. In this way, the slew rate of the output current signal 230 in the two-wire coupling 234 can be controlled to have improved slew rates, and preferably without overshoot or undershoot.

FIGS. 3, 4, 10, and 11 described below show drive current signals (e.g., 226a of FIG. 2) and resulting output current signals (e.g., 230 of FIG. 2). The drive current signals have first and second different drive current values that result in the output current signals having first and second different output current values. The first and second different output current values carry information, i.e., two-state binary information, to the destination circuit, e.g., destination circuit 102 of FIG. 1.

The drive current signal also can have at least one of a third drive current value or a fourth drive current value used to change or improve a wave shape (e.g., to improve a slew rate) of the output current signal. While third and fourth drive current values are described below, it will be apparent from discussion further below that any number of drive current values can be used, i.e., a plurality of drive current values can be used in place of at the third drive current value, the fourth drive current value, or both.

Figure 4A:
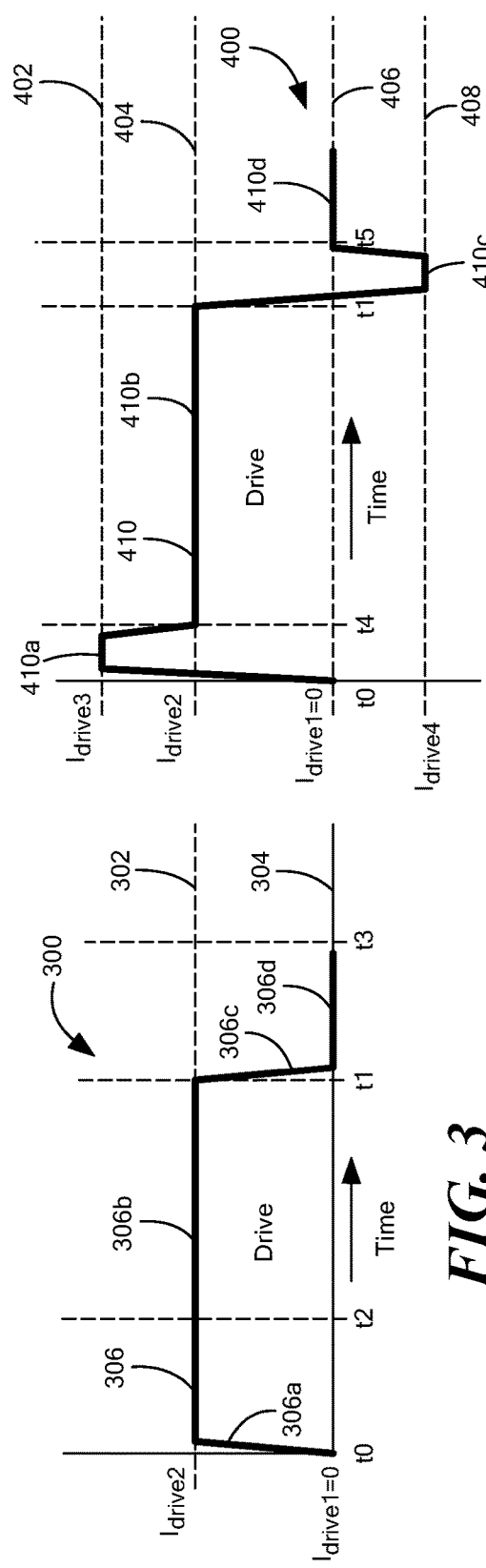
FIG. 4A is a graph showing an illustrative output current signal pulse related to the drive current signal pulse of FIG. 4, but as may be carried on a wire between the source electronic circuit of FIG. 2 and a destination electronic circuit, resulting in transitions with a faster slew rate.
Figure 4:
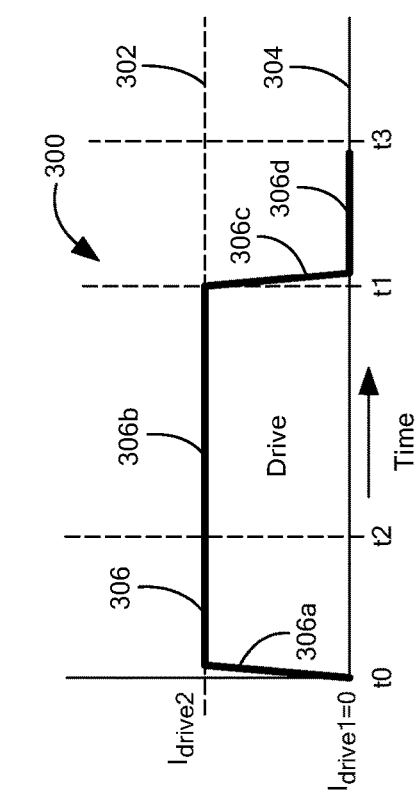
FIG. 4 is a graph showing an illustrative drive current signal pulse having first, second, third, and fourth different drive current values that may be generated within the driver circuit of FIG. 2.

While third and fourth drive current values are described in FIGS. 4 and 11 to achieve resulting output current signals with faster slew rates, in other embodiments, different third and fourth drive current values (or a plurality of drive current values in place of each one of the third and fourth drive current values) can be used to instead achieve resulting output current signals with slower slew rates. It will be apparent how to modify the third and fourth drive current values to achieve the resulting output current signals with slower slew rates. Furthermore, in some embodiments, the third and fourth drive current values (or plurality of drive current values) can be used to achieve resulting output current signals with a reduction of an overshoot of a state transition or an improvement or an undershoot. Thus, in general, the third and fourth current values, which occur proximate in time to transitions between the first and second current values, can be used to provide first and second altered transitions, altered from what the transitions would be were it not for the third and fourth drive current values. The alteration of transitions can include, but is not limited to, an increase of slew rate, a decrease of slew rate, an improvement of overshoot, and an improvement of undershoot.

Figure 3A:
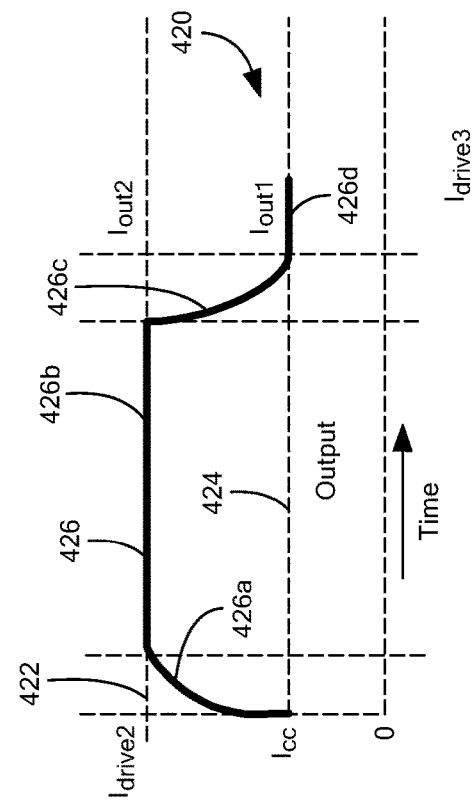
FIG. 3A is a graph showing an illustrative output current signal pulse related to the drive current signal pulse of FIG. 3, but as may be carried on a wire between the source electronic circuit of FIG. 2 and a destination electronic circuit, resulting in transitions with a lower slew rate.
Figure 3:
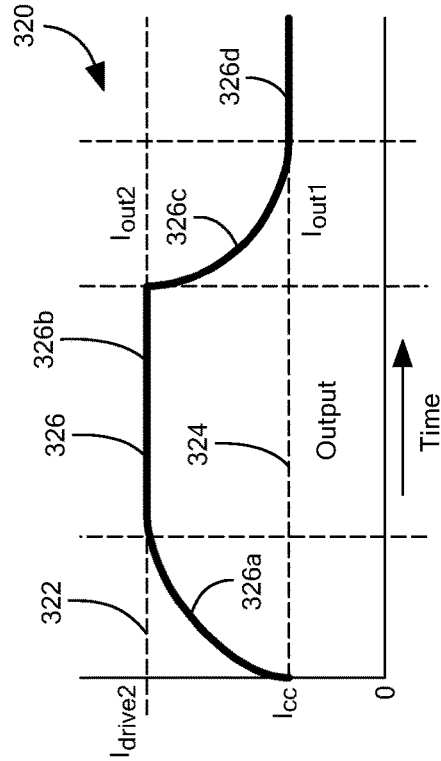
FIG. 3 is a graph showing an illustrative drive current signal pulse having first and second different drive current values that may be generated within the current driver circuit of FIG. 2.

FIGS. 3 and 4 show the first and second drive current signals generated in particular ways, while FIGS. 10 and 11 show the first and second different drive current signals generated in different particular ways.

Referring now to FIG. 3, a graph 300 can have a vertical axis with a scale in units of current in arbitrary units and a horizontal axis with a scale in units of time in arbitrary units.

As described above in conjunction with FIG. 2, the formatted signal 222a can have a frequency indicative of a speed of rotation of the gear 202 and pulse widths indicative of the direction of rotation of the gear 202. In essence, the slew rate processor 224 and the current driver circuit 203 are operable to result in the output current signal 230 (and 232) at the two-wire coupling 234 that has two-state (e.g., binary) signals with adequately fast slew rates, adjusted for the presence of the capacitor 239 and/or 236.

A drive current signal 306 can, in some embodiments, be indicative of the drive current signal 226a of FIG. 2 applied at the current node 228 of FIG. 2 without having special characteristics to result in the faster slew rate of the output current signal 230 of FIG. 2. The resulting slower slew rate is represented in FIG. 3A below.

The drive current signal 306 has a transition portion 306a, a flat portion 306b, a transition portion 306c, and a flat portion 306d. Transition portions are indicated to be faster, where faster and slower are used below to indicate relative slew rates.

The drive current signal 306 has two states represented by the flat portions 306b, 306d.

In some embodiments, a time period of a pulse from time t0 to time t1 can be representative of a direction of rotation of the gear 202 of FIG. 2, and a rate of similar pulses can be indicative of the speed of the rotation of the gear 202. In some embodiments, the time period from time t0 to time t1 can be about forty-five microseconds, about ninety microseconds, or about one hundred eighty microseconds.

While the current pulse from time t0 to time t1 is shown to be a positive pulse, in other embodiments, the pulse can be a negative pulse.

In a first signal state, the flat portion 306d can have a first drive signal value 304 (i.e., about zero), which can be indicative of the drive current generator 226 generating no current at the current node 228 of FIG. 2. Thus, during the flat portion 306d, and also before the transition portion 306a, in some embodiments, the drive current signal 226a of FIG. 2 can have a first drive current value of about zero.

In a second signal state, the flat portion 306b can have a second drive current value 302 indicative of current flowing out of the current node 228 of FIG. Thus, the drive current signal 226a of FIG. 2 can have the second drive current value 302 different than the first drive current value 304.

It should be apparent that the first and second drive current values 304, 302, can represent a two-state binary signal.

Referring now to FIG. 3A, a graph 320 can have a vertical axis with a scale in units of current in arbitrary units and a horizontal axis with a scale in units of time in arbitrary units.

An output current signal 326 is indicative of the output current signal 230 of FIG. 2.

The output current signal 326 has a transition portion 326a, a flat portion 326b, a transition portion 326c, and a flat portion 326d.

The output current signal 326 has two states represented by the flat portions 326b, 326d.

In a first signal state, the flat portion 326d can have a first output signal value 324 indicative of current flowing out of the current node 228 of FIG. 2 with a value equal to the current 241 (Icc) of FIG. 2, which is the current drawn by the functional circuit 201. Thus, to achieve the flat portion 326d, and also before the transition portion 326a, in some embodiments, the drive current signal 226a of FIG. 2 can have the first drive current value 304 of about zero.

In a second signal state, the flat portion 326b can have a second output signal value 322 indicative of current flowing out of the current node 228 of FIG. 2 and toward the current generator 226 of FIG. 2 with a value equal to the current 241 (Icc) of FIG. 2 plus an additional current. To achieve the flat portion 326b, the drive current signal 226a of FIG. 2 can have the second drive current value 302 different than the first drive current value 304.

It should be apparent that the first and second output current values 324, 322, can represent a two-state binary signal.

Transition portions 326a, 326c of the output current signal 326 are slower than the transition portions 306a, 306c of the drive current signal 306 due to operation of the capacitor 239 of FIG. 2, the capacitance 236 of FIG. 2, and an inductance like inductance 116 of FIG. 1.

Being slower, the transition portions 326a, 326c can present a particular problem to a destination circuit, for example, the destination circuit 102 of FIG. 1, which can receive the output current signal 326. Namely, a comparator, for example, the comparator 112 of FIG. 1, which can be used to receive the two wire current signal 114a, 114b and to transform the current signal into the voltage signal 112a, can experience output signal state edge placement inaccuracy (and possibly also output signal state chatter) due to electrical noise that may occur during the slower transition portions 326a, 326c. Faster transitions are often desirable and can result in more accurate output signal state edge placement (and possibly less state chatter).

Faster transitions are described below.

Referring now to FIG. 4, a graph 400 can have a vertical axis with a scale in units of current in arbitrary units and a horizontal axis with a scale in units of time in arbitrary units.

A drive current signal 410 is indicative of the drive current signal 226a of FIG. 2 applied at the current node 228 of FIG. 2 and, unlike the current signal 306 of FIG. 3, the drive current signal 410 has special characteristics to result in the faster slew rate of an associated output current signal, e.g., the output current signal 230 of FIG. 2. The resulting faster slew rate is represented in FIG. 4A below. Other embodiments described briefly below, can also make use of the switch 227, which can also be within the current driver circuit 203 of FIG. 2.

The drive current signal 410 has a flat portion 410a, a flat portion 410b, a flat portion 410c, and a flat portion 410d. Transition portions are not explicitly identified but will be recognized to be faster.

The drive current signal 410 has four states represented by the flat portions 410a, 410b, 410c, 410c.

In some embodiments, a time period of a pulse from time t0 to time t1 can be representative of a direction of rotation of the gear 202 of FIG. 2, and a rate of similar pulses can be indicative of the speed of the rotation of the gear 202. In some embodiments, the time period from time t0 to time t1 can be about forty-five microseconds, about ninety microseconds, or about one hundred eighty microseconds.

In a first signal state, the flat portion 410*d* can have a drive signal value 406 indicative of the drive current generator 226 generating, for example, about zero current at the current node 228 of FIG. 2, i.e., a drive current value of about zero. Thus, during the flat portion 410*d*, and also before the flat portion 410*a*, in some embodiments, the drive current signal 226*a* of FIG. 2 can have the first drive current value 406 of about zero In a second signal state, the flat portion 410*b* can have a second drive current value 404 indicative of current flowing out of the current node 228 of FIG. 2 with a value different than the first drive current value 406. Thus, the drive current signal 226*a* of FIG. 2 can have the second drive current value 404 different than the first drive current value 406.

It should be apparent that the first and second drive current values 406, 404, can represent a two-state binary signal.

In a third signal state, the flat portion 410*a* can have a drive signal value 402 indicative of current flowing out of the current node 228 of FIG. 2 with a value different than the second drive current value 404. Thus, the drive current signal 226*a* of FIG. 2 can have the third drive current value 402 different than the second drive current value 404. In some embodiments as shown, the third signal state has the third drive current value 402 different in amplitude, sign, or direction from the second drive current value 404.

In a fourth signal state, the flat portion 410*c* can have a fourth drive current value 408 indicative of current flowing into rather than out of the current node 228 of FIG. 2 with a value different than the first drive current value 406. Thus, the drive current signal 226*a* of FIG. 2 can have the fourth drive current value 408 different than the first drive current value 406. In some embodiments as shown, the fourth signal state has the fourth drive current value 408 different in amplitude, sign, or direction from the first drive current value 406.

From discussion below in conjunction with FIG. 4A, it will become apparent that the third and fourth drive current values 402, 408, can result in faster slew rates of a resulting output current signal.

The opposite direction current of the fourth signal state can be achieved in a variety of ways. In some embodiments, the drive current generator 226 of FIG. 2 can generate the drive current 226*a* in an opposite direction. One arrangement to achieve the opposite current direction is described below in conjunction with FIG. 12. In some other embodiments, in order to achieve a similar effect, the switch 227 of FIG. 2 can be opened during the fourth signal state, resulting in less current being drawn by the functional circuit 201 from the current node 228 during the fourth signal state.

Referring now to FIG. 4A, a graph 420 can have a vertical axis with a scale in units of current in arbitrary units and a horizontal axis with a scale in units of time in arbitrary units.

An output current signal 426 is indicative of the output current signal 230 of FIG. 2.

The output current signal 426 has a transition portion 426*a*, a flat portion 426*b*, a transition portion 426*c*, and a flat portion 426*d*. Transition portions 426*a*, 426*c* are indicated to be faster than the transition portions 326*a*, 326*c* of FIG. 3A.

In a first signal state, the flat portion 426*d* can have a first output signal value 424 indicative of current flowing out of the current node 228 of FIG. 2 with a value equal to the current 241 (Icc) of FIG. 2, which is the current drawn by the functional circuit 201. Thus, to achieve the flat portion 426*d*, and also before the transition portion 426*a*, in some embodiments, the drive current signal 410 of FIG. 3 can have the first drive current value 406 of about zero.

In a second signal state, the flat portion 426*b* can have a second output signal value 422 indicative of current flowing out of the current node 228 of FIG. 2 with a value equal to the current 241 (Icc) of FIG. 2 plus an additional current. To achieve the flat portion 426*b*, the drive current signal 410 can have the second drive current value 404 different than the first drive current value 406.

As described above, it should be apparent that the third and fourth drive current values 402, 408, can result in faster slew rates of the output current signal 426. The flat portion 410*a* having the drive signal value 402 can result in a faster transition region 426*a*. The flat portion 410*c* having the drive signal value 408 can result in a faster transition region 426*c*.

Transition portions 426*a*, 426*c* of the output current signal 426 may still be slower than the transition portions of the drive current signal 410 due to operation of the capacitor 239 and/or 236 of FIG. 2.

Being faster than the transition portions 326*a*, 326*c* of FIG. 3A, the transition portions 426*a*, 426*c* can result in more accurate output signal state edge placement (and possibly less state chatter).

FIGS. 3, 3A, 4, and 4A show signals with positive current pulses, where the term positive is indicative of a particular current direction made particular only by the horizontal Icc current axis in FIGS. 3A and 4A. Thus, positive currents of FIGS. 3, 3A, 4, and 4A flow out of the current node 228 of FIG. 2. In other embodiments, the drive current signals 306, 410 can be flipped about the zero current axis and drive current signal can be in the opposite direction, i.e., into the current node 228. With the flipped drive current signals, the output current signals 326, 426 of FIGS. 3A and 4A would be flipped about respective Icc current axes, since the Icc current 241 of FIG. 1 remains in a particular current direction.

In addition, in other embodiments, the drive current signals 306, 410 shown in FIGS. 3 and 4 can be moved upward or downward. In other words, the flat portions 306*d*, 410*d* need not have drive current values of about zero. As a result, the output current signals 326, 426 can move upward or downward accordingly.

In view of the above, it becomes difficult to specify whether a first drive current value is greater than or less than a second drive current value. At first, the difficulty would appear to be resolved by referring to absolute values of drive current values. However, even this can become difficult, for example, when referring to the fourth drive current value 408 of the flat portion 410*c* of the drive current signal 410, which, in the particular arrangement shown, has an opposite direction. In essence, the fourth current value 408 and also the third current value 402 may both have absolute values greater than the second current value 404. Thus, instead, it can merely be recited that the various drive current values and various output signal values described herein are different from each other.

In other embodiments, the flat portions 410*a*, 410*c* need not be flat having single drive current values. For example, in other embodiments, one of or both of the flat portions 410*a*, 410*c* can have multiple flat steps, or a can have values that change linear or nonlinearly with time. In these embodiments, still it can be desirable to provide an output current with faster transition regions (and also without undershoot or overshoot) like the output current signal 426 of FIG. 4A.

In still other embodiments, only one of the flat portions 410a or 410c is generated. As a result, only one of the transition regions 426a, 426c of FIG. 4A has a faster transition.

Figure 12:
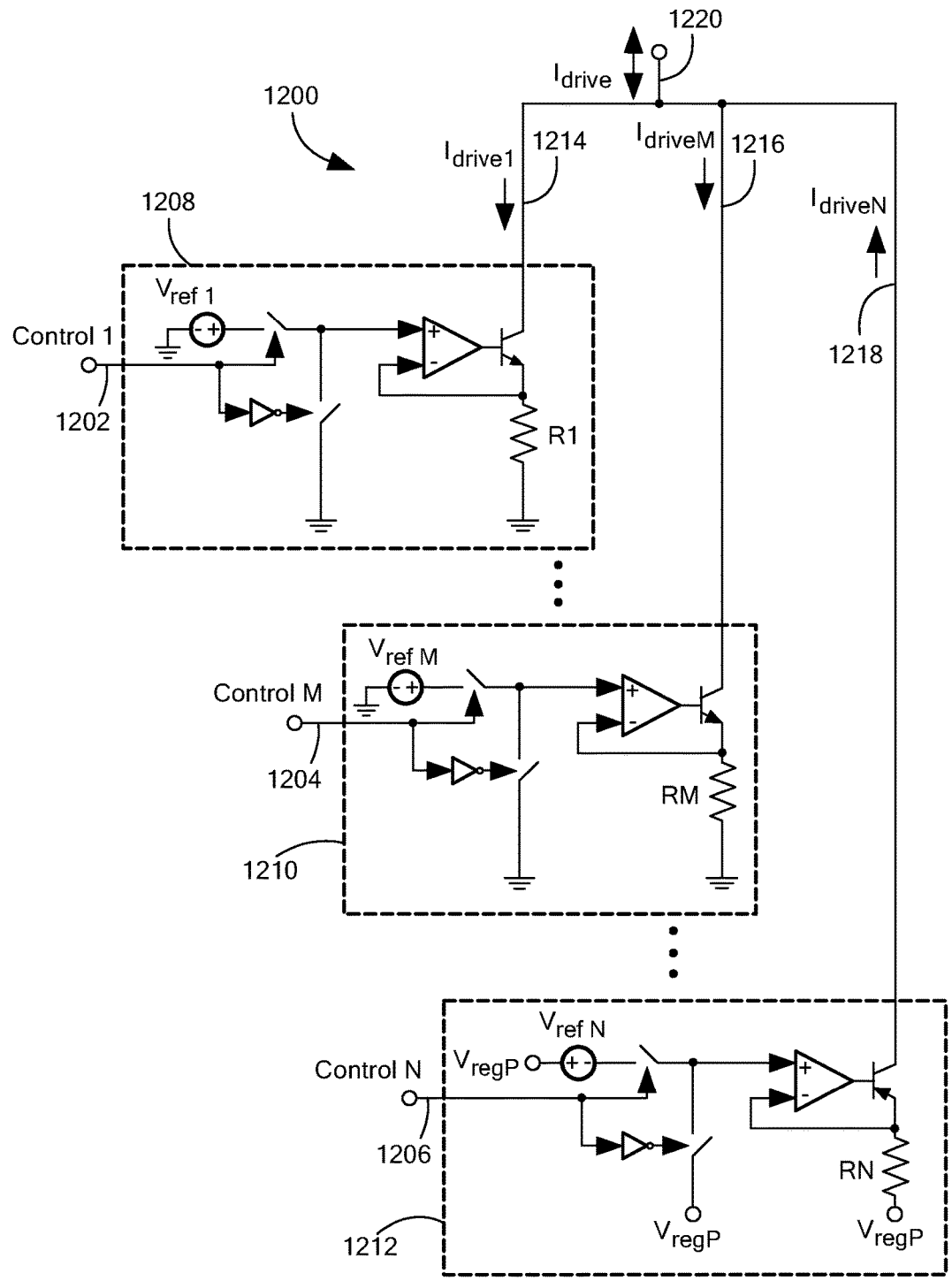
FIG. 12 is a schematic diagram showing an illustrative current driver circuit that can be used as the driver circuit of FIG. 2 to generate currents in two different directions.

FIGS. 5-9 show a variety of different circuits that can provide the drive current generator 226 of FIG. 2, each operable to generate a plurality of drive current values but in the same current direction. FIG. 12 shows a circuit that can be used to provide the drive current generator 226 of FIG. 2 operable to generate a plurality of drive current values and in different selected directions.

Figure 5:
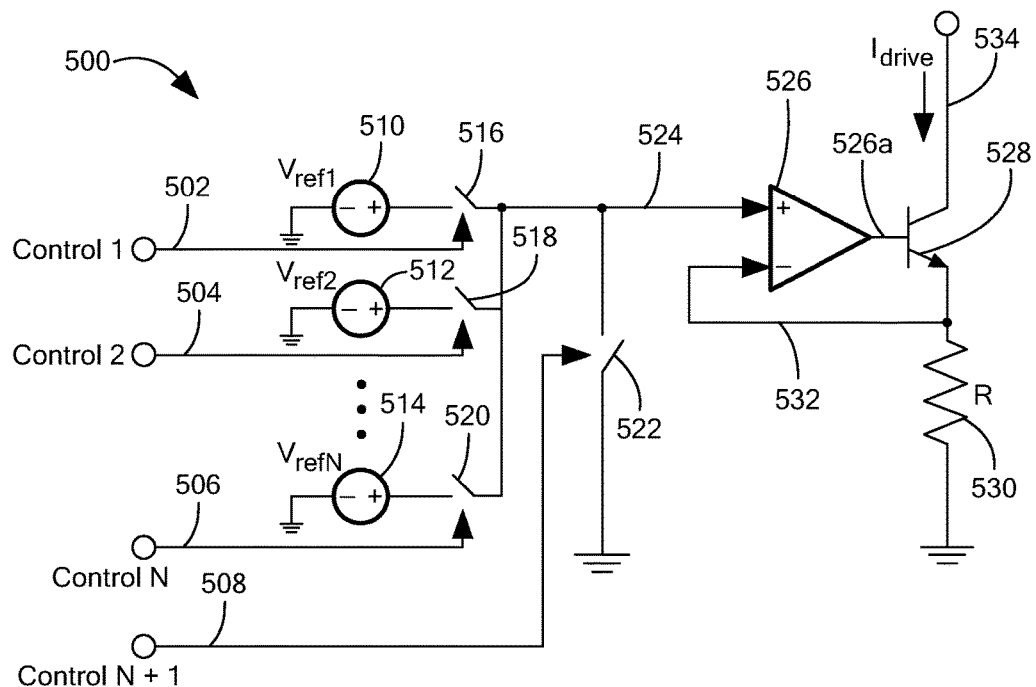
FIGS. 5-9 are schematic diagrams showing different illustrative current driver circuits that can be used as the current driver circuit of FIG. 2 to generate currents in one direction.

Referring now to FIG. 5, an illustrative drive current generator 500 can include a plurality of voltage references 510-514 coupled to input nodes of prospective switches 516-520. Output nodes of the switches 516-520 can be coupled together at a signal 524. Control nodes of the switches 516-520 can be coupled to receive respective control signals 502-506.

Another switch 522 can have an input node coupled between the output nodes of the switches 516-520 and a reference voltage, for example, ground. The switch 522 can have control node coupled to receive a control signal 508.

Taken together, the control signals 502-508 can represent the control signal 224b of FIG. 2.

The signal 524 can be received by a first input node of an amplifier 526. The amplifier 526 can be operable to generate amplified signal 526a. A transistor 528, for example, an NPN bipolar transistor 528, can have a base node coupled to the amplifier signal 526a. An emitter node of the transistor 528 can be coupled to a second input node of the amplifier 526. In other embodiments, other types of transistors can be used in place of the transistor 528.

A resistor 530 can be coupled between the emitter node of the transistor 528 and a reference voltage, for example, ground.

A drive current signal 534 can be generated at a collector node of the transistor 528.

In operation, by way of the control signal 502-508, certain ones of, or none of, the voltage references 510-514 are selected to provide a voltage as the signal 524 at the first input node of the amplifier 526. The drive current 534 has a drive current value selected by which one of the reference voltages 510-514 is selected or whether the switch 522 is closed. If the switch 522 is closed, the drive current 534 has a drive current value of zero.

Figure 6:
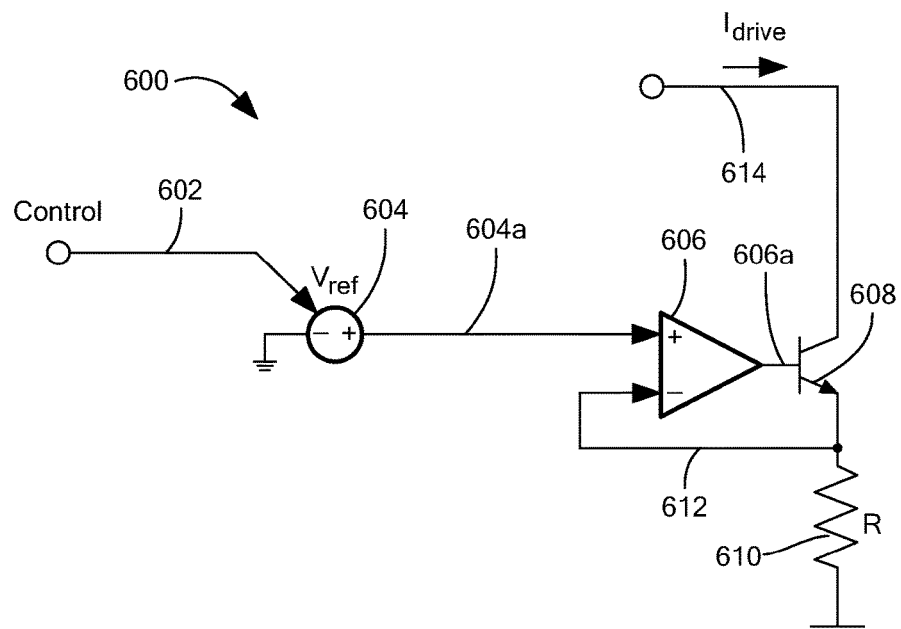

Referring now to FIG. 6, an illustrative drive current generator 600 can include a controllable voltage reference 604 having a voltage value controlled in accordance with a control signal 602. The control signal 602 can be representative of the control signal 224b of FIG. 2.

An output voltage 604a of the voltage reference 604 can be coupled to a first input node of an amplifier 606. The amplifier 606 can be operable to generate amplified signal 606a. A transistor 608, for example, an NPN bipolar transistor 608, can have a base node coupled to the amplifier signal 606a. An emitter node of the transistor 608 can be coupled to a second input node of the amplifier 606. In other embodiments, other types of transistors can be used in place of the transistor 608.

A resistor 610 can be coupled between the emitter node of the transistor 608 and a reference voltage, for example, ground.

A drive current signal 614 can be generated at a collector node of the transistor 606.

In operation, a value of the drive current signal 614 can be related to a value of the voltage reference 604, and therefore, to a value of the control signal 602.

Figure 7:
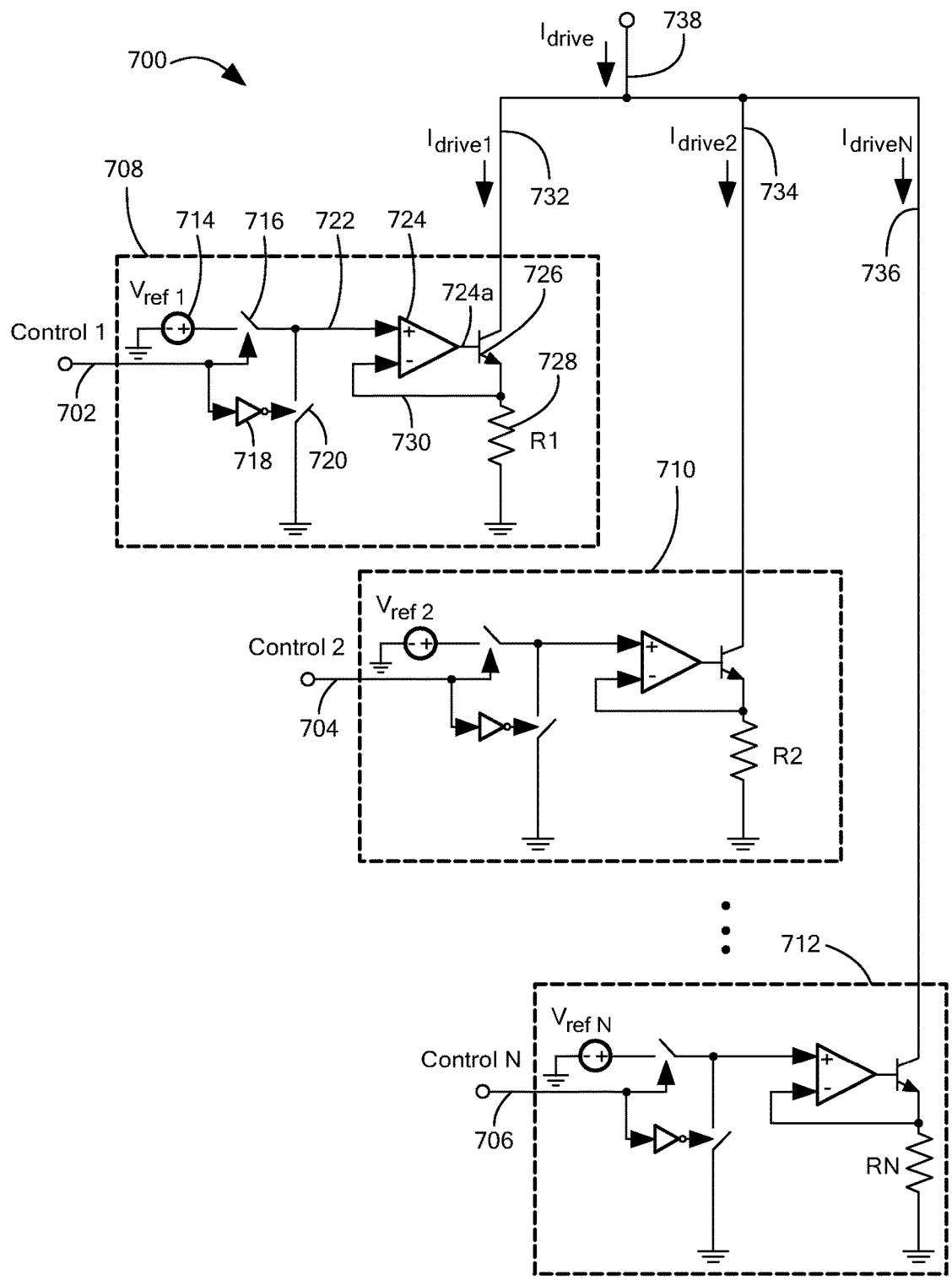

Referring now to FIG. 7, an illustrative drive current generator 700 can include a plurality of current generators 708, 710, 712 operable to generate respective drive current signals 732, 734, 736, each of which may be on or off.

Taking the current generator 708 as being representative of other ones of the current generators, the current generator 708 can include a voltage reference 714 coupled through a switch 716 to generate a signal 722 at a first input node of an amplifier 724. A control node of the switch 716 can be coupled to receive a control signal 702. An inverter 718 can be coupled to receive the control signal 702 and operable to generate an inverted control signal. A switch 720 can have a control node coupled to receive the inverted control signal. The switch 720 can be coupled between the signal 722 and a reference voltage, for example, ground.

The amplifier 724 can generate an amplified voltage 724a. A transistor 726, for example, an NPN bipolar transistor 726, can have a base node coupled to the amplifier signal 724a. An emitter node of the transistor 726 can be coupled to a second input node of the amplifier 724. In other embodiments, other types of transistors can be used in place of the transistor 726.

A resistor 728 can be coupled between the emitter node of the transistor 726 and a reference voltage, for example, ground.

The drive current signal 732 can be generated at a collector node of the transistor 726, and can be on or off depending upon a state of the control signal 702.

The current generators 710, 712 can include similar voltage references which can have the same value or different values as the voltage reference 714. Similarly, the current generators 710, 712 can have resistors with the same value or different values as the resistor 728. Either arrangement can result in the current generators 710, 712 having the drive currents 734, 736 with drive current values the same as or different than the drive current 732. Thus, the drive current generators 708, 710, 712 can turn on together or turn on one at a time to generate a drive current 738 with different drive current values.

The drive current circuit 700 can have any number of drive current generators.

Figure 8:
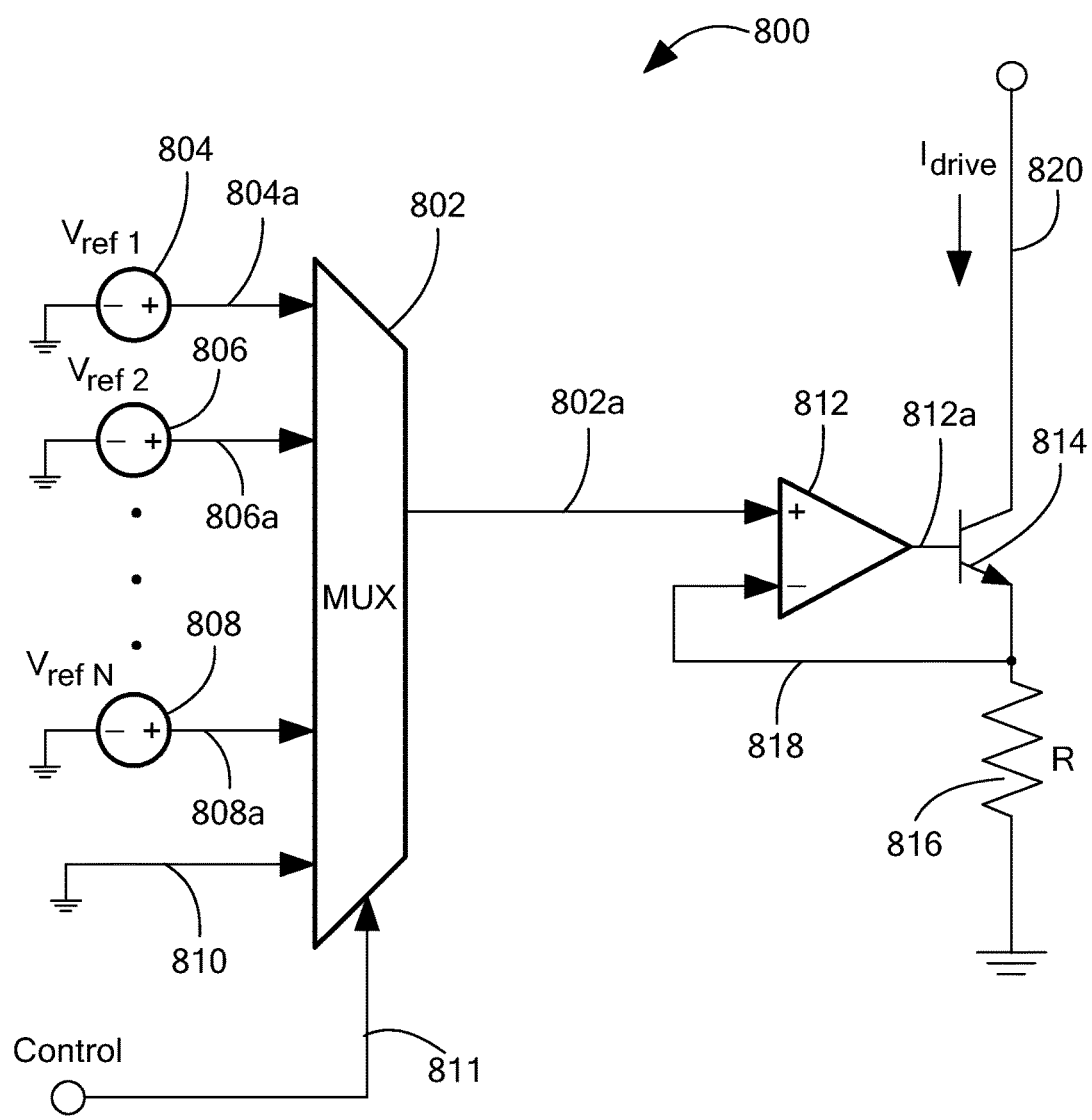

Referring now to FIG. 8, an illustrative drive current generator 800 can include a plurality of voltage references 804, 806, 808 coupled to provide reference voltages 804a 806a, 808a to a multi-input multiplexer 802. A reference voltage 810, for example a ground voltage can also be provided at an input of the multi-input multiplexer 802.

The multi-input multiplexer 802 can be coupled to receive a control signal 811 that can be the same as or similar to the control signal 224b of FIG. 2.

A multiplexed signal 802a from the multi-input multiplexer 802 can be coupled to a first input node of an amplifier 812. A transistor 814, for example, an NPN bipolar transistor 814, can have a base node coupled to the amplifier signal 812a. An emitter node of the transistor 814 can be coupled to a second input node of the amplifier 812. In other embodiments, other types of transistors can be used in place of the transistor 814.

A resistor 816 can be coupled between the emitter node of the transistor 814 and a reference voltage, for example, ground.

A drive current signal 820 can be generated at a collector node of the transistor 814, and can have a drive current value that can be on or off depending upon a state of the control signal 811.

Figure 9:
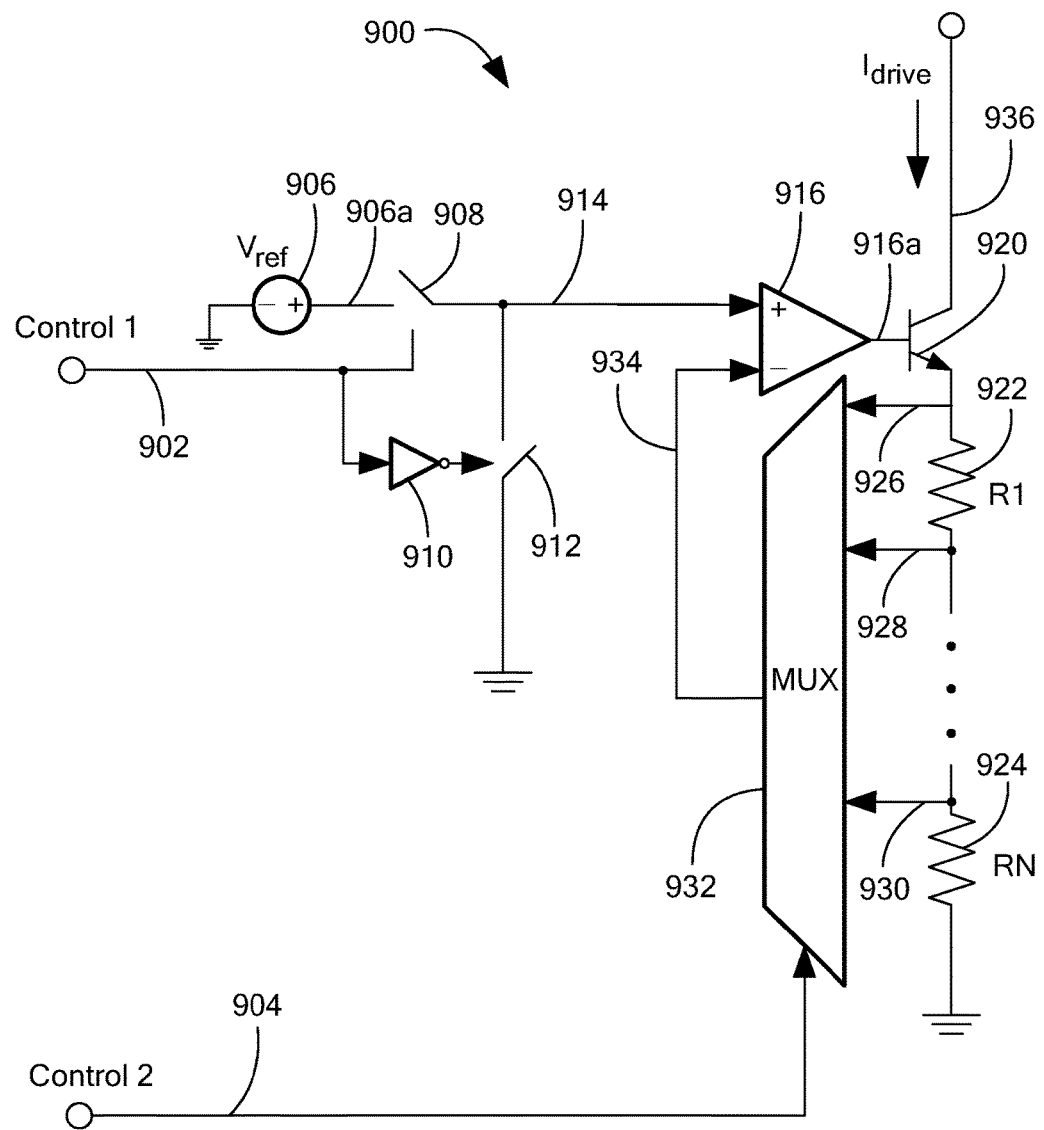

Referring now to FIG. 9, an illustrative drive current generator 900 can include a voltage reference 906 operable to generate a reference voltage 906a.

The reference voltage 906a can be coupled through a switch 908 to generate a signal 914 at a first input node of an amplifier 916. A control node of the switch 908 can be coupled to receive a control signal 902. An inverter 910 can be coupled to receive the control signal 902 and operable to generate an inverted control signal. A switch 912 can have a control node coupled to receive the inverted control signal. The switch 912 can be coupled between the signal 914 and a reference voltage, for example, ground.

The amplifier 916 can generate an amplified signal 916a. A transistor 920, for example, an NPN bipolar transistor 920, can have a base node coupled to the amplified signal 916a. An emitter node of the transistor 920 can be coupled to resistor ladder having a plurality of series coupled resistors, e.g., 922, 924.

Output taps, e.g., 926, 928, 930 of the resistor ladder can be coupled to input nodes of a multi-input multiplexer 932. The multi-input multiplexer 932 can also be coupled to receive a control signal 904. Taken together, the control signals 902, 904 can be the same as or similar to the control signal 224b of FIG. 2. An output node of the multi-input multiplexer 932 can be coupled to a second input node of the amplifier 916.

A drive current signal 936 can be generated at a collector node of the transistor 920, and can have a drive current value that can be on or off depending upon a state of the control signal 904.

As described above, FIGS. 3 and 4 show the first and second drive current signals generated in particular ways, while FIGS. 10 and 11 show the first and second different drive current signals generated in different particular ways.

Referring now to FIGS. 10, 10A, 11, 11A, drive current signals and output current signals can be generated by the magnetic field sensor 200 of FIG. 2, but in a different way than the drive current signals and output current signals of FIGS. 3, 3A, 4, 4A. In essence, and referring briefly to FIGS. 3 and 4 above, the first and second different drive current values 304, 302, respectively, and 406, 404, respectively, can be generated by the drive current generator 226 of FIG. 2.

As described above, while the term "drive current" is used to describe the drive current 226a of FIG. 2 generated by the drive current generator 226, it should be apparent that, for drive currents generated by the drive current generator 226 in an opposite direction (i.e., into the current node 228), the same effect as the opposite direction drive currents can be achieved by operation of the switch 227. In essence, an opposite direction drive current 226a that feeds current into the current node 228 can have the same effect as stopping or reducing a current that is drawn from the current node by operation of the switch 227. Therefore, as used herein, the term "drive current" is used to describe both the drive current signal 226a generated by the drive current generator 226 and also changes in current at the current node 228 due to operation of the switch 227.

Thus, where indicated, drive current signal values described in conjunction with FIGS. 10 and 11 below, like the drive current signal of FIGS. 3 and 4 above, are described below, for clarity, to be generated as the drive current signal 226a of FIG. 2. However, equivalently, some drive current signal values described below can be generated by operation of the switch 227 of FIG. 2.

Referring now to FIG. 10, a graph 1000 can have a vertical axis with a scale in units of current in arbitrary units and a horizontal axis with a scale in units of time in arbitrary units.

A drive current signal 1006 can, in some embodiments, be indicative of the drive current signal 226a of FIG. 2 applied at the current node 228 of FIG. 2 without having special characteristics to result in the faster slew rate of the output current signal 230 of FIG. 2. The resulting slower slew rate is represented in FIG. 10A below.

The drive current signal 1006 has a transition portion 1006a, a flat portion 1006b, a transition portion 1006c, and a flat portion 1006d. Transition portions are indicated to be faster, where faster and slower are used below to indicate relative slew rates.

The drive current signal 1006 has two states represented by the flat portions 1006b, 1006d.

In some embodiments, a time period of a pulse from time t0 to time t1 can be representative of a direction of rotation of the gear 202 of FIG. 2, and a rate of similar pulses can be indicative of the speed of the rotation of the gear 202. In some embodiments, the time period from time t0 to time t1 can be about forty-five microseconds, about ninety microseconds, or about one hundred eighty microseconds.

In a first signal state, the flat portion 1006d can have a first drive signal value 1002 (e.g., zero), which can be indicative of the drive current generator 226 generating no current at the current node 228 of FIG. 2. Thus, during the flat portion 1006d, and also before the transition portion 1006a, in some embodiments, the drive current signal 226a of FIG. 2 can have a first drive current value of about zero.

In a second signal state, the flat portion 1006b can have a second drive current value 1004 indicative of current flowing into (negative sign, opposite direction) the current node 228 of FIG. 2. Thus, the drive current signal 226a of FIG. 2 can have the second drive current value 1004 different than the first drive current value 1002.

As described above, in an alternate embodiment, equivalents to the first and second drive current values 1002, 1004, respectively, are instead achieved by operation of the switch 227, in which case, the switch 227 is opened during the time period from t0 to t1 and closed at other times.

It should be apparent that the first and second drive current values 1002, 1004, can represent a two-state binary signal.

For embodiments in which the switch 227 is opened to achieve the second drive current value 1004, it should be understood that the switch 227 cannot remain open for very long, since, during this time period from time t0 to time t1, the capacitor 239 must power the functional circuit 201. Thus, for theses embodiments, the pulse from time t0 to time t1 can be a relatively short duration negative transition pulse, which can have the above described pulse widths of about forty-five microseconds, about ninety microseconds, or about one hundred eighty microseconds.

In other embodiments, rather than the switch 227 used to achieve the second drive current value 1006, instead the control signal 224a of FIG. 2 can be used to place the functional circuit 201 into a low power condition resulting in the current 241 of FIG. 2 being less than the current Icc during the time period t0 to t1, but greater than zero.

Referring now to FIG. 10A, a graph 1020 can have a vertical axis with a scale in units of current in arbitrary units and a horizontal axis with a scale in units of time in arbitrary units.

An output current signal 1026 is indicative of the output current signal 230 of FIG. 2.

The output current signal 1026 has a transition portion 1026a, a flat portion 1026b, a transition portion 1026c, and a flat portion 1026d. Transition portions are indicated to be slower.

The output current signal 1026 has two states represented by the flat portions 1026b, 1026d.

In a first signal state, the flat portion 1026d can have a first output signal value 1022 indicative of current flowing out of the current node 228 of FIG. 2 with a value equal to the current 241 (Icc) of FIG. 2, which is the current drawn by the functional circuit 201. Thus, to achieve the flat portion 1026d, and also before the transition portion 1026a, in some embodiments, the drive current signal 226a of FIG. 2 can have the first drive current value 1002 of about zero.

In a second signal state, the flat portion 1026b can have a second output signal value 1024 of about zero. To achieve the flat portion 1026b, the drive current signal 226a of FIG. 2 can have the second drive current value 1004 different than the first drive current value 1002 and in an opposite direction.

In the alternate embodiment that instead makes use of the switch 227, the switch 227 can be opened during the time period t0 to t1. Thus, in alternate embodiments, it will be appreciated that the switch 227 can be used to generate the first and second different output current values 1022, 1024, respectively.

It should be apparent that the first and second output current values 1024, 1022, can represent a two-state binary signal.

Transition portions 1026a, 1026c of the output current signal 1026 are slower than the transition portions 1006a, 1006c of the drive current signal 1006 due to operation of the capacitor 239 and/or 236 of FIG. 2. Problems resulting from slow transitions are described above in conjunction with FIG. 3A.

Referring now to FIG. 11, a graph 1100 can have a vertical axis with a scale in units of current in arbitrary units and a horizontal axis with a scale in units of time in arbitrary units.

A drive current signal 1110 is indicative of the drive current signal 226a of FIG. 2 applied at the current node 228 of FIG. 2 and, unlike the current signal 1006 of FIG. 10, the drive current signal 1110 has special characteristics to result in the faster slew rate of an associated output current signal, e.g., the output current signal 230 of FIG. 2. The resulting faster slew rate is represented in FIG. 11A below.

The drive current signal 1110 has a flat portion 1110a, a flat portion 1110b, a flat portion 1110c, and a flat portion 1110d. Transition portions are not explicitly identified but will be recognized to be faster.

The drive current signal 1110 has four states represented by the flat portions 1110a, 1110b, 1110c, 1110c.

In some embodiments, a time period of a pulse from time t0 to time t1 can be representative of a direction of rotation of the gear 202 of FIG. 2, and a rate of similar pulses can be indicative of the speed of the rotation of the gear 202. In some embodiments, the time period from time t0 to time t1 can be about forty-five microseconds, about ninety microseconds, or about one hundred eighty microseconds.

In a first signal state, the flat portion 1110d can have a first drive signal value 1104 (e.g., zero), which can be indicative of the drive current generator 226 generating no current at the current node 228 of FIG. 2. Thus, during the flat portion 1110d, and also before the flat portion 1110a, in some embodiments, the drive current signal 226a of FIG. 2 can have a first drive current value of about zero.

In a second signal state, the flat portion 1110b can have a second drive current value 1106 indicative of current flowing into (negative sign, opposite direction) the current node 228 of FIG. 2. Thus, the drive current signal 226a of FIG. 2 can have the second drive current value 1006 different than the first drive current value 1004.

It should be apparent that the first and second drive current values 1104, 1106, respectively, can represent a two-state binary signal.

In a third signal state, the flat portion 1110a can have a drive signal value 1108 indicative of current flowing into (negative sign, opposite direction) with a value different than the second drive current value 1106. Thus, the drive current signal 226a of FIG. 2 can have the third drive current value 1108 different than the second drive current value 1106. In some embodiments as shown, the third signal state has the third drive current value 1108 different in amplitude, sign, or direction from the second drive current value 1106.

In a fourth signal state, the flat portion 1110c can have a fourth drive current value 1102 indicative of current flowing out of the current node 228 of FIG. 2 with a value different than the first drive current value 1104. Thus, the drive current signal 226a of FIG. 2 can have the fourth drive current value 1102 different than the first drive current value 1104. In some embodiments as shown, the fourth signal state has the fourth drive current value 1102 different in amplitude, sign, or direction from the first drive current value 1104.

From discussion below in conjunction with FIG. 11A, it will become apparent that the third and fourth drive current values 1108, 1102, respectively, can result in faster slew rates of a resulting output current signal.

The opposite direction current of the fourth signal state can be achieved in a variety of ways. In some embodiments, the drive current generator 226 of FIG. 2 can generate the drive current 226a in an opposite direction. One arrangement to achieve the opposite current direction is described below in conjunction with FIG. 12. In some other embodiments, in order to achieve a similar effect, the switch 227 of FIG. 2 can be opened during the second signal state (from time t0 to time t1), resulting in less current being drawn by the functional circuit 201 from the current node 228 during the second signal state.

Referring now to FIG. 11A, a graph 1120 can have a vertical axis with a scale in units of current in arbitrary units and a horizontal axis with a scale in units of time in arbitrary units.

An output current signal 1126 is indicative of the output current signal 230 of FIG. 2.

The output current signal 1126 has a transition portion 1126a, a flat portion 1126b, a transition portion 1126c, and a flat portion 1126d. Transition portions 1126a, 1126c are indicated to be faster than the transition portions 1026a, 1026c of FIG. 10A.

In a first signal state, the flat portion 1126d can have a first output signal value 1122 indicative of current flowing out of the current node 228 of FIG. 2 with a value equal to the current 241 (Icc) of FIG. 2, which is the current drawn by the functional circuit 201. Thus, to achieve the flat portion 1126d, and also before the transition portion 1126a, in some embodiments, the drive current signal 1110 of FIG. 11 can have the first drive current value 1104 of about zero.

In a second signal state, the flat portion 1126b can have a second output signal value 1124 indicative of no current flowing out of the current node 228 of FIG. 2. To achieve the flat portion 1126b, the drive current signal 1110 can have the second drive current value 1106 different than the first drive current value 1104.

As described above, it should be apparent that the third and fourth drive current values 1102, 1108, can result in faster slew rates of the output current signal 1126. The flat portion 1110a having the drive signal value 1108 can result in a faster transition region 1126a. The flat portion 1110c having the drive signal value 1102 can result in a faster transition region 1126c.

Transition portions 1126a, 1126c of the output current signal 1126 may still be slower than the transition portions of the drive current signal 1110 due to operation of the capacitor 239 and/or 236 of FIG. 2.

Being faster than the transition portions 1026a, 1026c of FIG. 10A, the transition portions 1126a, 1126c can result in more accurate output signal state edge placement (and possibly less state chatter).

As described above in conjunction with FIGS. 3, 3A, 4, and 4A, in other embodiments, drive current signals and output current signals can be moved upward are downward in current, or flipped vertically about certain axes.

Referring now to FIG. 12, an illustrative drive current generator 1200 can be the same as or similar to the drive current generator 226 of FIG. 2. Comparing the drive current generator 1200 with the drive current generator 700 of FIG. 7, the drive current generator 1200 can include a plurality of drive generator circuits, e.g., 1208, 1210, operable to sink currents, e.g., currents 1214, 1216, and also a plurality of drive current circuits, e.g., 1212, operable to source currents, e.g., current 1218.

The drive generator circuits 1208, 1210 can be similar in structure and function to the drive generator circuits described above in conjunction with FIG. 7.

The drive generator circuit 1212 can also be similar in structure to the drive generator circuits described above in conjunction FIG. 7. However, unlike the drive generator circuits described above in conjunction with FIG. 7, the drive generator circuit 1212 makes use of a higher voltage 243a (VregP) generated by the functional circuit 201 of FIG. 7 to drive the drive current 1218 in an opposite direction.

Control signals, e.g., 1202, 1204, 1206, can be operational to turn on or off the various current generator circuits, e.g., 1208, 1210, 1212. The control signals 1202, 1204, 1206 can be representative of the control signal 224b of FIG. 2.

The drive currents, e.g., 1214, 1216, 1218, can be summed together to provide the drive current 1220 comparable to the drive current 226a of FIG. 2.

All references cited herein are hereby incorporated herein by reference in their entirety.

Having described preferred embodiments, which serve to illustrate various concepts, structures and techniques, which are the subject of this patent, it will now become apparent that other embodiments incorporating these concepts, structures and techniques may be used. Accordingly, it is submitted that the scope of the patent should not be limited to the described embodiments but rather should be limited only by the spirit and scope of the following claims.

Elements of embodiments described herein may be combined to form other embodiments not specifically set forth above. Various elements, which are described in the context of a single embodiment, may also be provided separately or in any suitable subcombination. Other embodiments not specifically described herein are also within the scope of the following claims.

What is claimed is:

1. An electronic circuit, comprising:
a semiconductor substrate;
a current node disposed upon the semiconductor substrate and operable to communicate an output current signal from the electronic circuit;
a reactance coupled to the current node; and
a current driver circuit disposed upon the semiconductor substrate, the current driver circuit coupled to the current node, wherein the current driver circuit is operable to provide a drive current signal with a plurality of drive current values into or out of the current node,
wherein the plurality of drive current values results in the output current signal with a first output current value and a second different output current value,
wherein the plurality of drive current values comprise:
a first drive current value indicative of the first output current value;
a second different drive current value indicative of the second different output current value; and
at least one of:
a third different drive current value different than the second drive current value and operable to result in a first altered transition from the first output current value to the second output current value, the third different drive current value having a first time period that begins proximate in time to a beginning of the first altered transition from the first output current value to the second output current value and ends prior to a beginning of the second different output current value; or
a fourth different drive current value different than the first drive current value and operable to result in a second altered transition from the second output current value to the first output current value, the fourth different drive current value having a second time period that begins proximate in time to a beginning of the second altered transition from the second output current value to the first output current value and ends prior to a beginning of the first output current value.

2. The electronic circuit of claim 1, wherein the first altered transition comprises a first faster slew rate and the second altered transition comprises a second faster slew rate.

3. The electronic circuit of claim 1, wherein the first altered transition comprises a first slower slew rate and the second altered transition comprises a second slower slew rate.

4. The electronic circuit of claim 1, wherein the reactance comprises an inductance.

5. The electronic circuit of claim 1, wherein the reactance comprises a capacitance.

6. The electronic circuit of claim 5, wherein the capacitance results from a capacitor coupled to the current output node.

7. The electronic circuit of claim 6, further comprising:
a functional circuit disposed upon the semiconductor substrate, the functional circuit coupled to the current driver circuit,
wherein the current driver circuit comprises a switch disposed upon the semiconductor substrate and coupled between the capacitor and the current node, wherein, when the switch is open, at least a portion of the functional circuit is disconnected from the input voltage resulting in at least one of the first or second, third, and fourth drive current values, and wherein, when the switch is closed, the at least a portion of the functional circuit is connected to the input voltage, resulting in a different at least one of the first, second, third, and fourth drive current values.

8. The electronic circuit of claim 1, wherein the current output node comprises a dual function node operable to receive an input voltage from outside of the electronic circuit and operable to communicate the output current signal from the electronic circuit on the same wire.

9. The electronic circuit of claim 1, wherein the current driver circuit comprises a plurality of voltage references for generating a plurality of voltage reference values, wherein the current driver circuit is operable to generate the drive current with the plurality of drive current values related to the plurality of voltage reference values.

10. The electronic circuit of claim 1, wherein the current driver circuit comprises a controllable voltage reference coupled to receive a control signal to control a plurality of reference voltage values of the controllable voltage reference, wherein the current driver circuit is operable to generate the drive current with the plurality of drive current values related to the plurality of voltage reference values.

11. The electronic circuit of claim 1, wherein the current driver circuit comprises a plurality of current driver circuits coupled in parallel, the plurality of current driver circuits operable to generate the drive current with the plurality of drive current values.

12. The electronic circuit of claim 1, wherein the current driver circuit comprises:
  a plurality of voltage references for generating a plurality of voltage reference values; and
  a multiplexer having a plurality of input nodes and a control node, the plurality of voltage references coupled to the plurality of input nodes of the multiplexer, wherein the current driver circuit is operable to generate the drive current with the plurality of drive current values related to the plurality of voltage reference values, each one of the plurality of different drive current values determined by a control signal received at the control node of the multiplexer.

13. The electronic circuit of claim 1, wherein the current driver circuit comprises:
  a voltage reference for generating a voltage reference value;
  an amplifier having a first input node, a second input node and an output node, the first input of the amplifier coupled to the voltage reference;
  a transistor having a control node a current input node and a current output node;
  a plurality of resistors coupled in a series resistor ladder having a plurality of ladder taps with a corresponding plurality of ladder tap values, the series resistor ladder having a current input node and a current output node, the current input node of the resistor ladder coupled to the current output node of the transistor; and
  a multiplexer having a plurality of input nodes, and output node and a control node, the plurality of input nodes coupled to the plurality of ladder taps, the output node of the multiplexer coupled to the second input node of the amplifier, the current driver circuit operable to generate the drive current with the plurality of drive current values at the current input node of the transistor determined by a control signal received at the control node of the multiplexer.

14. The electronic circuit of claim 1, further comprising a functional circuit disposed upon the semiconductor substrate, the functional circuit coupled to the current driver circuit.

15. The electronic circuit of claim 14, wherein the functional circuit comprises a magnetic field sensor.

16. The electronic circuit of claim 14, wherein the functional circuit comprises a slew rate processor operable to select from among the first current value, the second current value, and the at least one of the third drive current value or the fourth current value.

17. The electronic circuit of claim 16, wherein the functional circuit further comprises a slew rate memory device operable to store a plurality of slew rate control values, wherein selected first, second, and third slew rate control values of the plurality of slew rate control values are related to the first current value, the second current value, and the at least one of the third drive current value or the fourth current value.

18. The electronic circuit of claim 17, wherein the slew rate memory device comprises a non-volatile memory device.

19. The electronic circuit of claim 16, further comprising a temperature sensing device disposed upon the semiconductor substrate and coupled to the slew rate processor, the temperature sensor operable to generate a temperature signal indicative of a temperature of the semiconductor substrate, the slew rate processor operable to change the at least one of the third drive current value or the fourth current value in accordance with the temperature signal.

20. The integrated circuit of claim 1, wherein the first or the second drive current value has a first time duration of about forty-five microseconds and the at least one of the third drive current value or the fourth current value has a second time duration substantially less than forty-five microseconds.

21. A method of driving an output current signal from a current output node of an electronic circuit disposed on a semiconductor substrate, comprising:
  providing a current generator circuit to generate a drive current signal with a plurality of drive current values into or out of a current node coupled to the output current signal,
  wherein the plurality of drive current values results in the output current signal with a first output current value and a second different output current value,
  wherein the plurality of drive current values comprise:
    a first drive current value indicative of the first output current value;
    a second different drive current value indicative of the second different output current value; and
    at least one of:
      a third different drive current value different than the second drive current value and operable to result in a first altered transition from the first output current value to the second output current value, the third different drive current value having a first time period that begins proximate in time to a beginning of the first altered transition from the first output current value to the second output current value and ends prior to a beginning of the second different output current value; or
      a fourth different drive current value different than the first drive current values and operable to result in a second altered transition from the second output current value to the first output current value, the fourth different drive current value having a second time period that begins proximate in time to a beginning of the second altered transition from the second output current value to the first output current value and ends prior to a beginning of the first output current value.

22. The method of claim 21, wherein the first altered transition comprises a first faster slew rate and the second altered transition comprises a second faster slew rate.

23. The method of claim 21, wherein the first altered transition is a first slower slew rate and the second altered transition comprises a second slower slew rate.

24. The method of claim 21, further comprising:
providing a functional circuit disposed upon the semiconductor substrate, the functional circuit coupled to the current driver circuit; and
providing a switch disposed upon the semiconductor substrate and coupled to the functional circuit,
wherein, when the switch is open, at least a portion of the functional circuit is disconnected from an input voltage resulting in at least one of the first, second, third, and fourth drive current values, and wherein, when the switch is closed, the at least a portion of the functional circuit is connected to the input voltage, resulting in a different at least one of the first, second, third, and fourth drive current values.

25. The method of claim 21, wherein the current output node comprises a dual function node operable to receive an input voltage from outside of the electronic circuit and operable to communicate the output current signal from the electronic circuit on the same wire.

26. The method of claim 21, further comprising:
generating a temperature signal indicative of a temperature of the electronic circuit; and
changing the at least one of the third drive current value or the fourth current value in accordance with the temperature signal.

27. The method of claim 21, wherein the first or the second drive current values has a first time duration of about forty-five microseconds and the at least one of the third drive current value or the fourth current value has a second time duration substantially less than forty-five microseconds.

* * * * *

UNITED STATES PATENT AND TRADEMARK OFFICE
CERTIFICATE OF CORRECTION

PATENT NO.      : 9,621,140 B1
APPLICATION NO. : 14/996689
DATED           : April 11, 2017
INVENTOR(S)     : Devon Fernandez et al.

It is certified that error appears in the above-identified patent and that said Letters Patent is hereby corrected as shown below:

Column 5, Line 6, delete "circuit" and replace with --circuits--.

Column 5, Line 43, delete "as" and replace with --is--.

Column 6, Line 8, delete "carried a" and replace with --carried in a--.

Column 7, Line 11, delete "field 200 sensor" and replace with --field sensor 200--.

Column 7, Line 17, delete "field 200 sensor" and replace with --field sensor 200--.

Column 8, Line 55, delete "and a" and replace with --in a--.

Column 10, Line 52, delete "place of at the" and replace with --place of the--.

Column 11, Line 57, delete "FIG." and replace with --FIG. 2.--.

Column 13, Line 10, delete "zero" and replace with --zero.--.

Column 14, Line 32, delete "and drive" and replace with --and the drive--.

Column 15, Line 22, delete "have control" and replace with --have a control--.

Column 15, Line 38, delete "signal" and replace with --signals--.

Column 15, Lines 42-43, delete "reference voltages 510-514" and replace with --voltage references 510-514--.

Column 17, Lines 16-17, delete "to resistor" and replace with --to a resistor--.

Column 18, Line 51, delete "theses" and replace with --these--.

Signed and Sealed this
Thirtieth Day of October, 2018

Andrei Iancu
*Director of the United States Patent and Trademark Office*

CERTIFICATE OF CORRECTION (continued)
U.S. Pat. No. 9,621,140 B1

Column 18, Line 53, delete "above described" and replace with --above-described--.

Column 19, Line 51, delete ", 1110*c*." and replace with --, 1110*d*.--.

Column 20, Line 10, delete ") with a" and replace with --) the current node 228 with a--.

Column 21, Line 35, delete "conjunction FIG. 7." and replace with --conjunction with FIG. 7.--.

Column 23, Line 47, delete "node a" and replace with --node, a--.

Column 23, Line 55, delete "and" and replace with --an--.

Column 24, Line 61, delete "values" and replace with --value--.